US009232662B2

(12) United States Patent
Hondo

(10) Patent No.: US 9,232,662 B2
(45) Date of Patent: Jan. 5, 2016

(54) MANUFACTURING METHOD FOR WIRING BOARD

(71) Applicant: Takaharu Hondo, Sakura (JP)

(72) Inventor: Takaharu Hondo, Sakura (JP)

(73) Assignee: FUJIKURA LTD., Tokyo (JP)

( * ) Notice: Subject to any disclaimer, the term of this patent is extended or adjusted under 35 U.S.C. 154(b) by 505 days.

(21) Appl. No.: 13/712,033

(22) Filed: Dec. 12, 2012

(65) Prior Publication Data

US 2013/0146218 A1 Jun. 13, 2013

Related U.S. Application Data

(63) Continuation of application No. PCT/JP2011/066238, filed on Jul. 15, 2011.

(30) Foreign Application Priority Data

Jul. 16, 2010 (JP) ................................ 2010-161743
Jul. 16, 2010 (JP) ................................ 2010-161776

(51) Int. Cl.
*H05K 3/10* (2006.01)
*H05K 3/00* (2006.01)
*H05K 3/46* (2006.01)

(52) U.S. Cl.
CPC ............... *H05K 3/10* (2013.01); *H05K 3/0044* (2013.01); *H05K 3/465* (2013.01); *H05K 3/005* (2013.01); *H05K 3/107* (2013.01); *H05K 2203/0108* (2013.01); *Y10T 156/1039* (2015.01)

(58) Field of Classification Search
CPC .................... H05K 2203/0108; H05K 3/0044; H05K 3/005; H05K 3/10; H05K 3/107; Y10T 156/1039

USPC .......................................... 156/219, 245, 246
See application file for complete search history.

(56) References Cited

U.S. PATENT DOCUMENTS 7,351,660 B2   4/2008  Brewer et al.
2002/0066672 A1   6/2002  Iijima et al.
(Continued)

FOREIGN PATENT DOCUMENTS

CN        1440232 A     9/2003
JP        11-298143 A   10/1999
(Continued)

OTHER PUBLICATIONS

Office Action issued by the Taiwanese Patent Office in Taiwanese Application No. 100125255 dated Jun. 28, 2013.
(Continued)

*Primary Examiner* — Philip Tucker
*Assistant Examiner* — Vicki Wu
(74) *Attorney, Agent, or Firm* — Sughrue Mion, PLLC

(57) ABSTRACT

The method includes: preparing a first substrate including first wirings; preparing a mold having a stamping surface that includes convex portions formed depending on wiring patterns of a second substrate to be laminated on the first substrate and projections formed depending on via patterns; pressing, while heating, the mold against the second insulating sheet so that end portions of the projections are exposed at the other main surface side of the second insulating sheet; laminating, while heating, the second insulating sheet on a first insulating sheet so that the exposed end portions contact the first wirings; releasing, the mold from the second insulating sheet; and filling a conductive material in groove portions and holes formed in the second insulating sheet.

3 Claims, 23 Drawing Sheets

(56) References Cited

U.S. PATENT DOCUMENTS

| | | |
|---|---|---|
| 2003/0155653 A1 | 8/2003 | Iijima et al. |
| 2003/0178726 A1* | 9/2003 | Ogawa ............... H01L 21/4857 257/758 |
| 2004/0137103 A1 | 7/2004 | Lin |
| 2005/0161804 A1 | 7/2005 | Iijima et al. |
| 2007/0013049 A1 | 1/2007 | Asai et al. |
| 2008/0014336 A1 | 1/2008 | Asai et al. |
| 2008/0023815 A1 | 1/2008 | Asai et al. |

FOREIGN PATENT DOCUMENTS

| | | |
|---|---|---|
| JP | 2001-196703 A | 7/2001 |
| JP | 2001-244609 A | 9/2001 |
| JP | 2002-171048 A | 6/2002 |
| JP | 2003-303938 A | 10/2003 |
| JP | 2003-309370 A | 10/2003 |
| TW | I257271 B | 6/2006 |
| TW | I277380 B | 3/2007 |

OTHER PUBLICATIONS

Office Action issued by the Japanese Patent Office in Japanese Application No. 2012-524609 dated Jun. 18, 2013.
Communication dated Nov. 15, 2014 from The State Intellectual Property Office of The People's Republic of China in counterpart Chinese Patent Application No. 201180027835.0.
International Search Report for PCT/JP2011/066238 dated Aug. 16, 2011.

* cited by examiner

MANUFACTURING METHOD FOR WIRING BOARD

BACKGROUND OF THE INVENTION

1. Technical Field of the Invention

The present invention relates to a manufacturing method for a wiring board.

For those designated countries which permit the incorporation by reference, the contents described and/or illustrated in the documents relevant to Patent Application No. 2010-161743 filed with Japan Patent Office on Jul. 16, 2010 and Patent application No. 2010-161776 filed with Japan Patent Office on Jul. 16, 2010 will be incorporated herein by reference as a part of the description and/or drawings of the present application.

2. Description of the Related Art

In order to achieve highly-dense wiring in association with downsizing electronic devices and enhancing the functionality thereof, an imprint method is known in which a mold is used to transfer concave shapes to an insulating sheet and the concave shapes are filled with a conductive material to form fine patterns (such as wiring patterns and via patterns).

In this imprint method, after the mold is released from the insulating sheet, if some resin remains in opening areas which have been formed by the mold and are to be connection portions for via patterns, then connection failures in via patterns or other troubles may possibly occur. In this respect, there is known an approach for removing such resin residues in opening areas using plasma etching or laser ablation (Patent Document 1: U.S. Pat. No. 7,351,660).

PRIOR ART DOCUMENT(S)

PATENT DOCUMENT(S)

[Patent Document 1] U.S. Pat. No. 7,351,660

SUMMARY OF THE INVENTION

Problems to be Solved by the Invention

However, if, in order to remove resin residues, plasma or laser light is irradiated to a substrate formed thereon with wiring patterns, then problems occur including that the wiring patterns may be damaged or partially lost.

Problems to be solved by the present invention include providing a manufacturing method for a wiring board in which resin is unlikely to remain on the bottom of an opening area formed in an insulating sheet, when a mold is released from the insulating sheet in an imprint method.

Means for Solving the Problems (1) A first invention in this application solves the above one or more problems by a manufacturing method for a wiring board. The method includes preparing a first substrate. The first substrate comprises a first insulating sheet and a first wiring formed on one main surface of the first insulating sheet. The method includes preparing a mold having a stamping surface. The stamping surface includes a convex portion and a projection. The convex portion is formed depending on a wiring pattern constituting at least a part of patterns of a second substrate to be laminated on the first substrate. The projection is formed depending on a via pattern constituting at least a part of the patterns. The method includes locating the stamping surface of the mold to face one main surface side of a second insulating sheet and heating the second insulating sheet to a first set temperature to press the mold against the one main surface of the second insulating sheet so that at least an end portion of the projection of the stamping surface is exposed at the other main surface side of the second insulating sheet. The method includes heating at least the second insulating sheet to a second set temperature to laminate the second insulating sheet on the first insulating sheet so that the end portion of the projection exposed at the other main surface of the second insulating sheet contacts the first wiring of the first insulating sheet. The method includes cooling at least the second insulating sheet to release the mold from the second insulating sheet and filling a conductive material in a groove portion and a hole. The groove portion and the hole are formed in the second insulating sheet respectively by the convex portion of the mold and the projection of the mold.

(2) In the above first invention, the pressing the mold against the one main surface of the second insulating sheet may be such that a length h1 of the projection formed depending on the via pattern is a thickness h2 of the second insulating sheet or more, and the laminating the second insulating sheet on the first insulating sheet may be such that the length h1 of the projection formed depending on the via pattern and the thickness h2 of the second insulating sheet are substantially the same.

(3) In the above first invention, the pressing the mold against the one main surface of the second insulating sheet may include locating a cushion sheet on the other main surface side of the second insulating sheet, and the laminating the second insulating sheet on the first insulating sheet may include removing the cushion sheet.

(4) A second invention in this application solves the above one or more problems by a manufacturing method for a wiring board. The method includes preparing a first substrate. The first substrate comprises a first insulating sheet and a first wiring formed on one main surface of the first insulating sheet. The first wiring may be embedded in the first insulating sheet. The method includes forming a wiring portion on one main surface of a flat plate-like supporting member. The wiring portion includes a convex portion and a projection. The convex portion functions as a wiring pattern constituting at least a part of patterns of a second substrate to be laminated on the first substrate. The projection functions as a via pattern constituting at least a part of the patterns. The method includes locating the wiring portion formed on the supporting member to face one main surface side of a second insulating sheet and heating the second insulating sheet to a first set temperature to press the wiring portion against the one main surface of the second insulating sheet so that at least an end portion of the projection of the wiring portion is exposed at the other main surface side of the second insulating sheet. The method includes heating the second insulating sheet to a second set temperature to laminate the second insulating sheet on the first insulating sheet so that the end portion of the projection exposed at the other main surface of the second insulating sheet contacts the first wiring exposed at the one main surface of the first insulating sheet. The second insulating sheet may be heated to the second set temperature in a state where the wiring portion is inserted in the second insulating sheet due to the pressing the wiring portion against the one main surface of the second insulating sheet. The second set temperature may be lower than the first temperature. The method includes removing the supporting member from the second insulating sheet.

(5) In the above second invention, the pressing the wiring portion formed on the supporting member against the one main surface of the second insulating sheet may be such that a length h3 of the projection functioning as the via pattern is a thickness h4 of the second insulating sheet or more, and the laminating the second insulating sheet on the first insulating sheet may be such that the length h3 of the projection functioning as the via pattern and the thickness h4 of the second insulating sheet are substantially the same.

(6) In the above second invention, the pressing the wiring portion formed on the supporting member against the one main surface of the second insulating sheet may include locating a cushion sheet on the other main surface side of the second insulating sheet, and the laminating the second insulating sheet on the first insulating sheet may include removing the cushion sheet.

Advantageous Effect of the Invention

According to the present invention, a manufacturing method for a wiring board can be provided in which resin residue is unlikely to remain on the bottom of an opening area of an insulating sheet to be formed therein a via pattern, when the via pattern is formed by using an imprint method. Therefore, plasma irradiation, laser irradiation and chemical etching are not necessary for removing resin residue. As a result, the wiring pattern can be prevented from damages such as generating defects and being lost due to plasma irradiation, laser irradiation and chemical etching etc, and a wiring board having high reliability can thus be provided.

DESCRIPTION OF THE PREFERRED EMBODIMENT

<First Embodiment of First Invention>

Hereinafter, the manufacturing method for a wiring board according to the first embodiment of the first invention will be described. The first invention is for the purpose of providing a manufacturing method for a wiring board in which resin residues are unlikely to remain in holes, corresponding to via patterns, of an insulating sheet when a mold for imprinting is released from the insulating sheet. That is, an object of the first invention is to provide a manufacturing method for a wiring board in which processes, such as plasma irradiation, laser irradiation and chemical etching, are not necessary to be performed for removing resin residues remaining in holes of the insulating sheet.

The configuration of a wiring board 100 obtained by the manufacturing method according to the first embodiment of the present invention will first be described with reference to FIG. 1, and the manufacturing method according to the first embodiment of the present invention will then be described with reference to FIG. 2 to FIG. 7.

(Configuration of Wiring Board)

Figure 1:
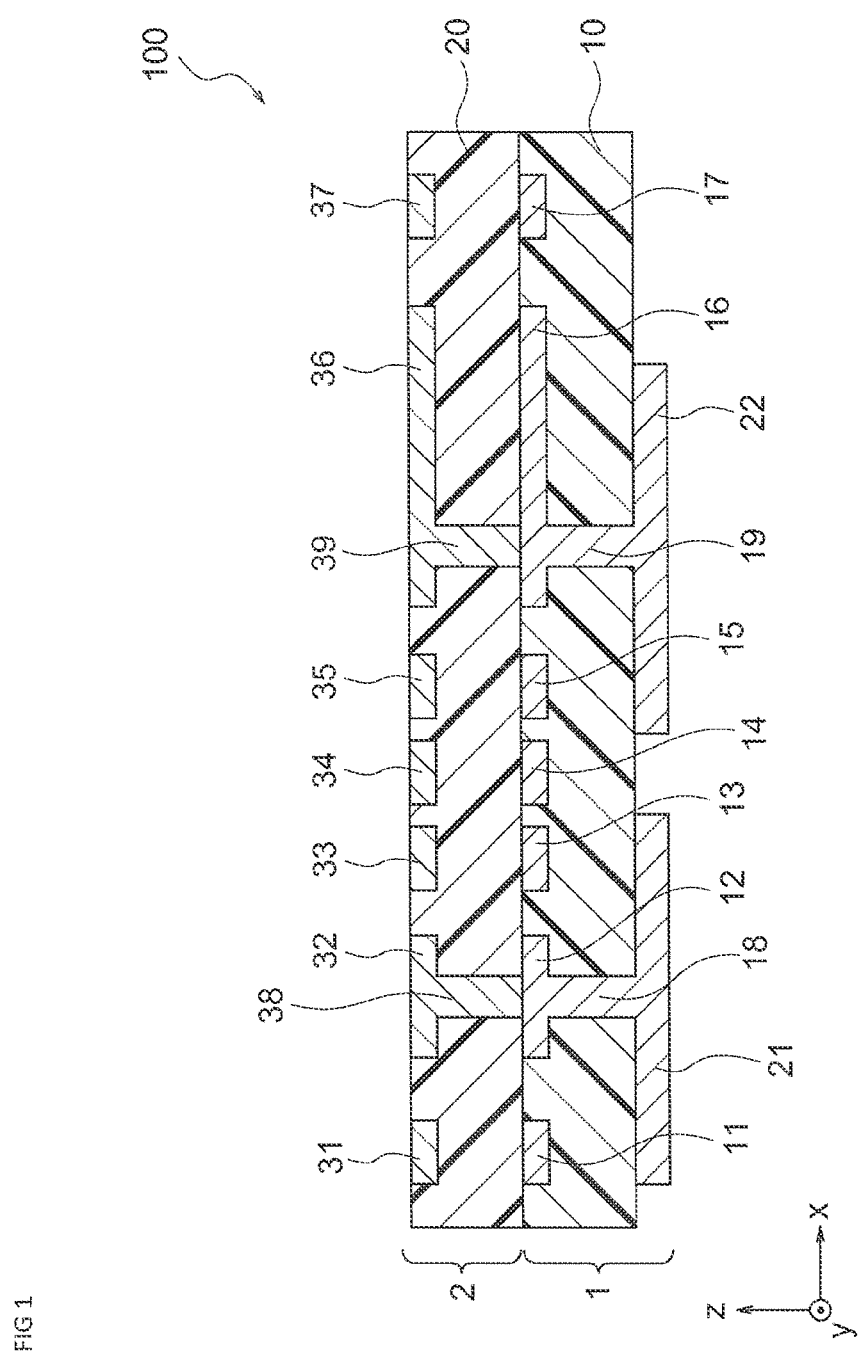
FIG. 1 is a cross-sectional view illustrating one example of a wiring board according to a first embodiment of the first invention.

As shown in FIG. 1, the wiring board 100 according to the first embodiment of the present invention is a multilayer board that comprises a first substrate 1 and a second substrate 2 laminated on one main surface side (upper side in the figure) of the first substrate 1. While the present embodiment is described for an example of the wiring board 100 which is configured of two substrates, the present invention is applicable to a wiring board 100 which is configured of three or more substrates. Note that the present embodiment is described with reference to an x-y plane shown in the figure as a plane along the wiring board 100 (substrates 1 and 2 and insulating sheets 10 and 20) and a z-axis direction as the laminating direction, and the upper side along the z-axis in the figure represents the one main surface side.

The first substrate 1 located on the lower side in the figure comprises: a first insulating sheet 10; first upper side wirings 11 to 17 formed on one main surface (the upper side in the figure: here and hereinafter) of the first insulating sheet 10; first lower side wirings 21 and 22 formed on the other main surface (the lower side in the figure: here and hereinafter) of the first insulating sheet 10; and first vias 18 and 19 respectively connecting the first upper side wirings 12 and 16 and the first lower side wirings 21 and 22.

The second substrate 2 comprises: a second insulating sheet 20 laminated on the one main surface (the upper side in the figure) of the first insulating sheet 10; second upper side wirings 31 to 37 formed on one main surface (main surface on the upper side in the figure) of the second insulating sheet 20; and second vias 38 and 39 respectively connecting the second upper side wirings 32 and 36 and the first upper side wirings 12 and 16, wherein the second upper side wirings 32 and 36 are included in the second upper side wirings 31 to 37.

The second upper side wirings 31 to 37 and the second vias 38 and 39 are convexly formed toward the interior of the second insulating sheet 20 from the one main surface (the upper side main surface) of the second insulating sheet 20. That is, the one main surface of the second insulating sheet 20 formed with the second upper side wirings 31 to 37 and connection portions for the second vias 38 and 39 is flat, so that another substrate not shown can be laminated flatly thereon, i.e. without any space, or other electric components not shown can be mounted thereon.

As a material for the first insulating sheet 10 and the second insulating sheet 20, thermosetting resin such as epoxy resin or thermoplastic resin such as thermoplastic polyimide and liquid-crystal polymer may be used, for example. As a material for the first upper side wirings 11 to 17, the first lower side wirings 21 and 22, the first vias 18 and 19, the second upper side wirings 31 to 37 and the second vias 38 and 39, copper (Cu), silver (Ag), gold (Au) or other materials having conductivity may be used.

Although not particularly limited, in the first upper side wirings 11 to 17 and the first lower side wirings 21 and 22 constituting a part of wiring patterns of the first substrate 1 and the second upper side wirings 31 to 37 constituting a part of wiring patterns of the second substrate 2, line-and-space areas may be arranged such that the wiring width is approximately 5 μm to 15 μm and the wiring space is approximately 5 μm to 15 μm. In addition, the diameter (thickness) of the first vias 18 and 19 and the second vias 38 and 39 is 2 μm or more and 35 μm or less, preferably 2 μm or more and 15 μm or less, and more preferably 2 μm or more and less than 10 μm. The length of the first vias 18 and 19 and the second vias 38 and 39 in the present embodiment is 1 μm or more and 50 μm or less, and preferably 10 μm or more and 40 μm or less. The aspect ratio is 0.5 to 25 and preferably 1 to 25, and may be about 1 to 4 in the present example.

(Manufacturing Method for Wiring Board)

One example of a manufacturing method for the wiring board 100 according to the first embodiment of the present invention will then be described with reference to FIG. 2 to FIG. 7.

Figure 2:
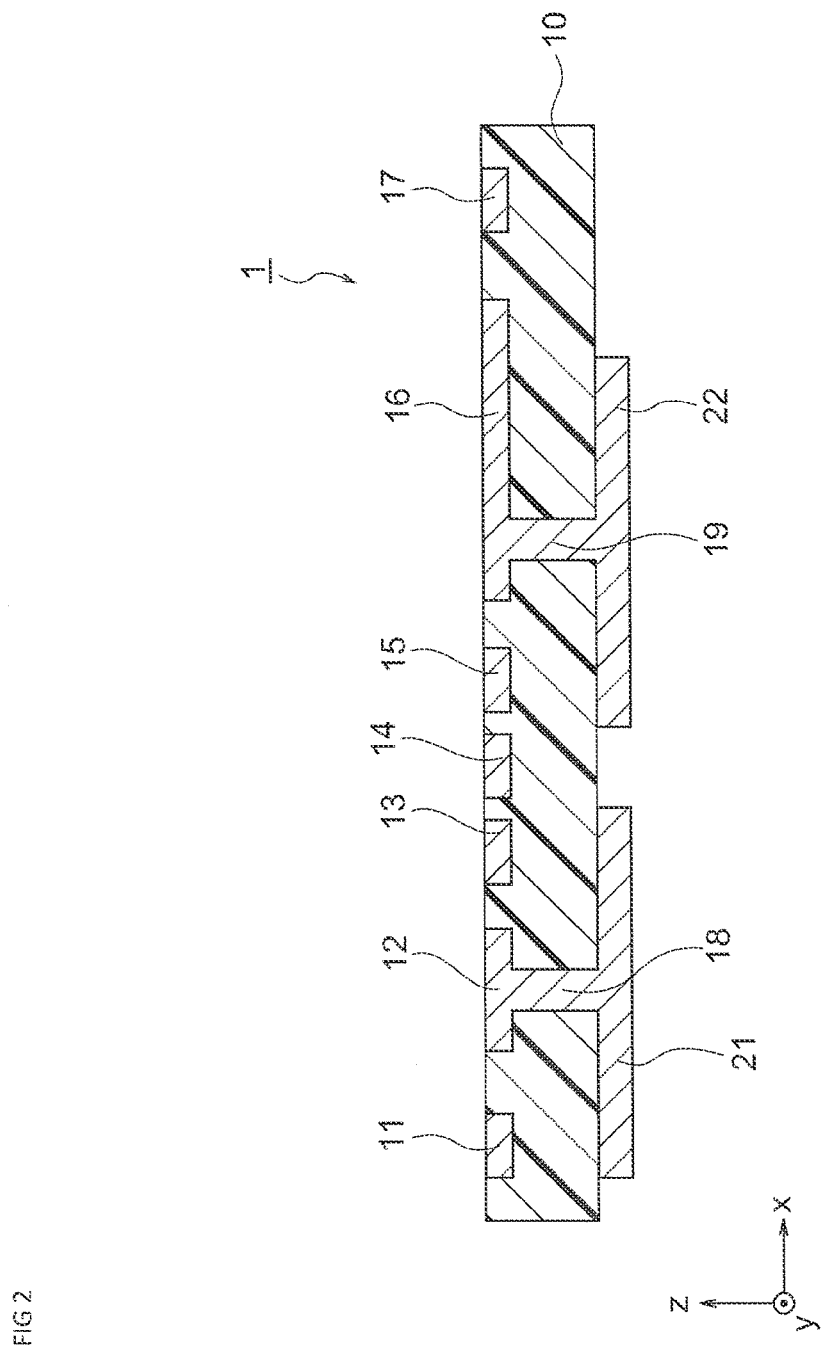
FIG. 2 is a process cross-sectional view illustrating one example of a manufacturing method for the wiring board according to the first embodiment of the first invention.

At first, the first substrate 1 shown in FIG. 2 is prepared. As the first substrate 1, a substrate may be used which comprises at least the first insulating sheet 10 and the first upper side wirings 11 to 17 formed on one main surface (surface on which the second substrate 2 is to be laminated) of the first insulating sheet 10, but in the present example, a double-side substrate is used as the first substrate 1, in which the first upper side wirings 11 to 17 are formed on the one main surface of the first insulating sheet 10 so as to be embedded therein and the first lower side wirings 21 and 22 are formed on the other main surface.

While the product ion method for the first substrate 1 shown in FIG. 2 is not particularly limited, a mold is used for example, which comprises a stamping surface including convex portions and projections formed respectively depending on the first upper side wirings 11 to 17 and the first vias 18 and 19, to transfer patterns to the one main surface (upper surface in the figure) of the first insulating sheet 10 thereby forming groove portions (concave portions) and holes respectively depending on the first upper side wirings 11 to 17 and the first vias 18 and 19, a plating process or other appropriate process is performed to fill these concave portions and holes with a conductive material, and the first substrate 1 can thereby be produced as a single-side substrate, in which the first upper side wirings 11 to 17 and the first vias 18 and 19 are formed on the one main surface side of the first insulating sheet 10. Further, a resist is applied to the other main surface (lower surface in the figure) of the first insulating sheet 10, photolithography is used to pattern the resist depending on the first lower side wirings 21 and 22, plating is then performed, and the first substrate 1 can thereby produced as a double-side substrate, in which the first lower side wirings 21 and 22 are further formed on the other main surface side of the first insulating sheet 10. Of course, both surfaces may be formed thereon with resists having certain patterns, and thereafter a plating process may be concurrently performed for the both surfaces.

Alternatively, holes depending on the first vias 18 and 19 are formed by irradiating laser beam or other beam to the one main surface (upper surface in the figure) side of the first insulating sheet 10, thereafter, photolithography is used to pattern a resist depending on patterns of the first upper side wirings 11 to 17 and the first vias 18 and 19, concave portions depending on the first upper side wirings 11 to 17 and the holes depending on the first vias 18 and 19 are subjected to nonelectrolytic plating and/or electrolytic plating, and the first substrate 1 can thereby be produced as a single-side substrate, in which the first upper side wirings 11 to 17 and the first vias 18 and 19 are formed on the one main surface side of the first insulating sheet 10. Note that the plating may be substituted by screen printing which uses conductive paste to fill a conductive material in concave portions depending on the first upper side wirings 11 to 17 and in holes depending on the first vias 18 and 19. Further, the first substrate formed thereon with the first lower side wirings 21 and 22 can be produced by printing conductive paste to the other main surface (lower surface in the figure) side of the first insulating sheet 10 using a printing plate depending on patterns of the first lower side wirings 21 and 22. As the production method for the first substrate 1, any production method for double-side substrate known in the art at the time of filing this application may appropriately be utilized. If no wiring pattern is necessary for the other main surface side of the first substrate 1, then any production method for single-side substrate known in the art at the time of filing this application may appropriately be utilized.

Figure 3:
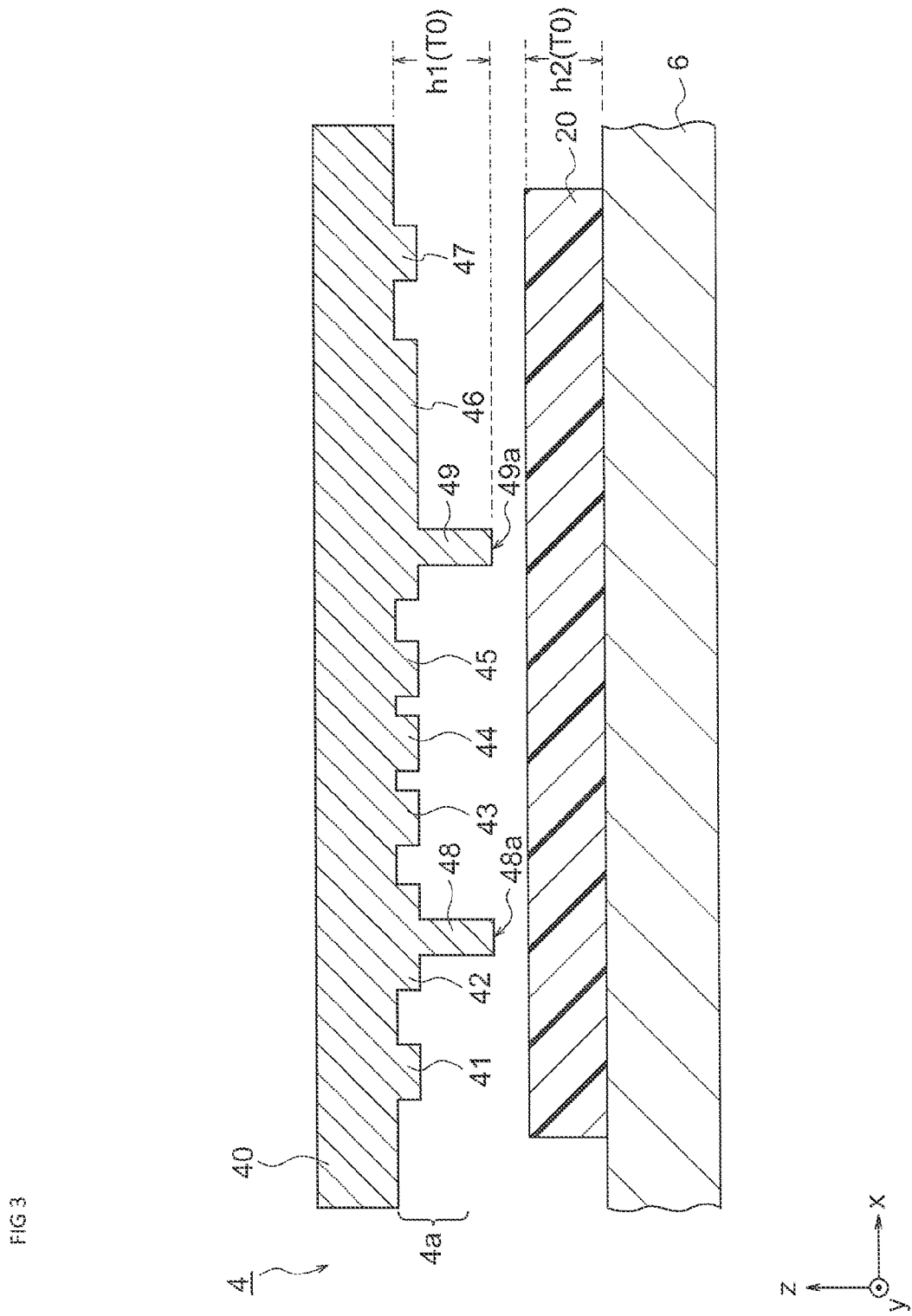
FIG. 3 is a process cross-sectional view illustrating one example of the manufacturing method for the wiring board according to the first embodiment of the first invention.

Before or after or in parallel with the preparation of the first substrate 1, a mold 4 shown in FIG. 3 is prepared. As shown in FIG. 3, the mold 4 according to the present embodiment has a stamping surface 4a that includes: convex portions 41 to 47 formed depending on the second upper side wirings 31 to 37 constituting a part of patterns of the second substrate 2 to be laminated on the first substrate 1; and projections 48 and 49 formed depending on the second vias 38 and 39 constituting another part of the patterns.

The stamping surface 4a functions as a working-purpose plate (original plate) for transferring a concave-convex shape (including the projections 48 and 49 and the convex portions 41 to 47), which is used for constituting desired patterns, to the second insulating sheet 20. Reference character 4a in FIG. 3 specifies the entire surface to be pressed against the second insulating sheet, on the other main surface side (lower side in the figure) of the mold 4 formed thereon with the concave-convex shape including the convex portions 41 to 47 and projections 48 and 49 for constituting the desired patterns.

While the production method for the mold 4 is not particularly limited, the mold 4 comprising the stamping surface 4a can be obtained for example through: preparing a resin plate body applied to a main surface of a supporting plate body for producing a mold; irradiating laser or electron beam to a main surface of the resin plate body to form holes depending on via patterns; laminating a resist layer on the resin plate body; exposing or heating predetermined regions of the resist layer depending on wiring patterns and thereafter selectively removing the predetermined regions using etching liquid to form groove portions depending on the wiring patterns; and filling a mold material in the holes and the groove portions formed in the resin plate body while covering the main surface of the resin plate body with the mold material.

Further, while the filling method using the mold material is not particularly limited, the mold material can be filled in the holes and in the groove portions for example through: employing sputtering or other appropriate approach to form conductive layers, which will be seed layers in a plating process or the like to be subsequently performed, in regions to be filled with the mold material, such as in the holes and groove portions of the resin plate body; and thereafter performing plating using the mold material such as copper (Cu) or nickel (Ni). Of course, the holes and the groove portions may also be filled with the mold material by printing conductive nano-paste including copper (Cu), silver (Ag) and/or other appropriate conductive material. Examples of the mold material to be used include, but not limited to, conductive materials such as copper (Cu), silver (Ag) and other metals as well as insulating materials (nonconductive materials) such as glass. As the supporting plate body, a copper foil or other appropriate material capable of being removed by etching may be used. The thickness of a copper foil to function as the supporting plate body may be approximately 80 to 120 µm. In addition, as the resin plate body, a light-curable or heat-curable resist film may for example be used, which is a material soluble in alkaline or acidic solution. The thickness of the resin plate body may be 15 to 40 µm.

Subsequently, the supporting plate body is removed by using etching liquid such as ferric chloride solution to expose the surface of the resin plate body. Finally, the resin plate body is also removed through swelling by using aqueous solution of sodium hydroxide or other appropriate liquid. The stamping surface 4a can thereby be obtained which comprises the convex portions 41 to 47 and the projections 48 and 49 as will be described later with reference to FIG. 3. In view of the handling ability, the produced stamping surface 4a is applied to a main surface of a plate-like supporting member 40, and the mold 4 according to the present embodiment is thus obtained.

Note that the manufacturing method for the mold 4 is not particularly limited, and processes known in the art at the time of filing this application, such as a process using photolithography, a plating process, a polishing process and a laser irradiation process, may be combined to produce the mold 4 which comprises the stamping surface 4a formed thereon with the convex portions 41 to 47 and the projections 48 and 49.

Thereafter, as shown in FIG. 3, the mold 4 is located so that the stamping surface 4a faces a stage 6 of an imprint apparatus, on which a target object to be transferred thereto is to be placed. As shown in the figure, if the second insulating sheet 20 is set on the platen of the stage 6, then the stamping surface 4a of the mold 4 faces the one main surface side (upper side in the figure) of the second insulating sheet 20. Although not particularly limited, as the second insulating sheet 20, uncured (semi-cured) thermosetting resin such as epoxy resin or thermoplastic resin such as liquid-crystal polymer or thermoplastic polyimide may be used, for example.

As shown in FIG. 3, in a state at ambient temperature (T0) before mold clamping (before transfer process), the depth of the stamping surface 4a, i.e. the length h1 (T0) of the projections 48 and 49 formed on the stamping surface 4a, may be set as being the thickness h2 (T0) of the second insulating sheet 20 or more. The second insulating sheet 20 tends to expand in the subsequent heating process to increase in its thickness h2, and therefore, the thickness h2 (T0) of the second insulating sheet 20 at ambient temperature is preferred to be set as being equal to or thinner than the length h1 (T0) of the projections 48 and 49.

Subsequently, the second insulating sheet 20 is heated until it becomes a first set temperature T1. The first set temperature T1 is a temperature which is suitable for transferring the stamping surface 4a and which is defined depending on the heat deformation temperature or glass transition temperature (Tg) of the second insulating sheet 20. The first set temperature T1 when the pattern shape of the stamping surface 4a is transferred may be freely determined depending on the characteristics and the thickness of the second insulating sheet 20. As one example, the first set temperature T1 may be approximately 260° C. to 300° C. Note that heating the second insulating sheet 20 may be performed by directly heating the second insulating sheet 20 or by heating the mold 4 to indirectly heat the second insulating sheet which contacts the mold 4.

Figure 4:
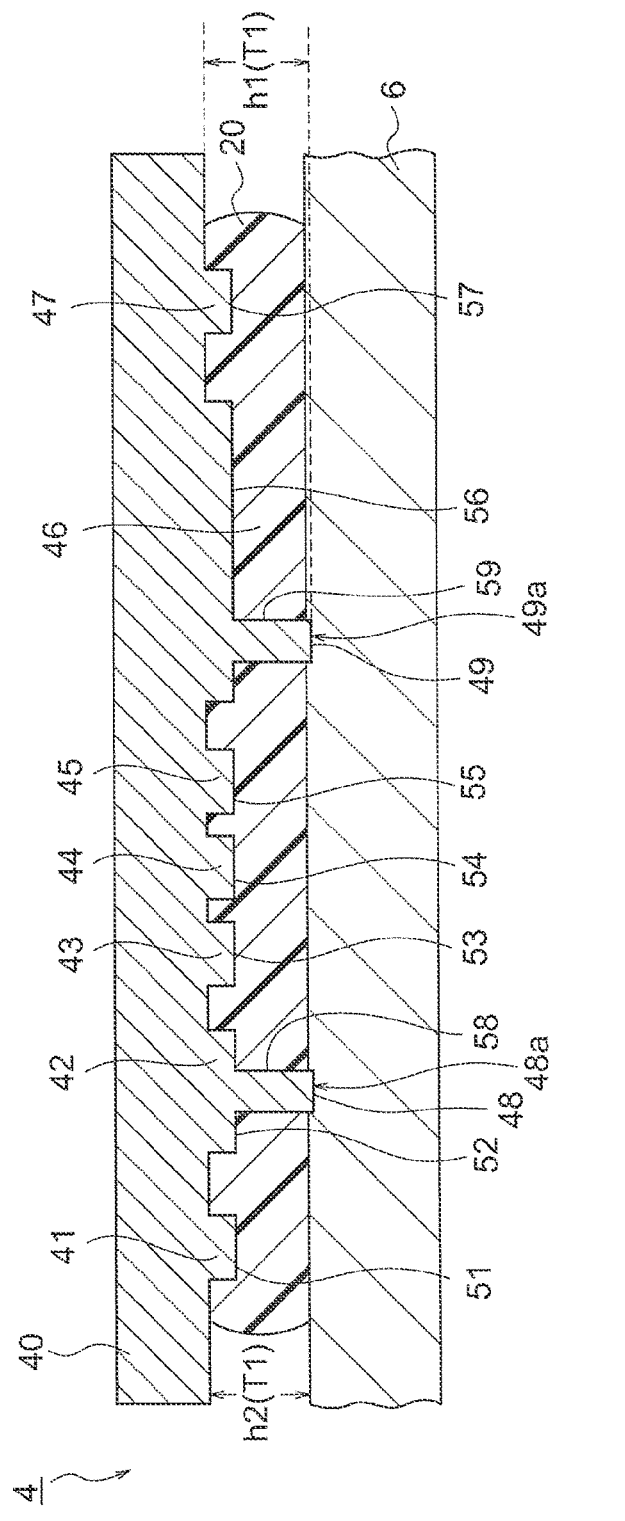
FIG. 4 is a process cross-sectional view illustrating one example of the manufacturing method for the wiring board according to the first embodiment of the first invention.

After the second insulating sheet 20 is heated to the first set temperature T1 (or after the mold 4 is heated to a temperature capable of heating the second insulating sheet 20 to the first set temperature T1 at the time of transferring), the stamping surface 4a of the mold 4 is pressed against the second insulating sheet 20, as shown in FIG. 4.

The projections 48 and 49 and the convex portions 41 to 47 of the stamping surface 4a are pressed into the second insulating sheet 20 having been heated to the first set temperature T1 to be softened. In the present embodiment, as shown in FIG. 4, the mold 4 may be pressed against the one main surface (upper side in the figure) of the second insulating sheet 20 so that at least end portions 48a and 49a of the projections 48 and 49 of the stamping surface 4a are exposed at the other main surface side (lower side in the figure) of the second insulating sheet 20. The end portions 48a and 49a of the projections 48 and 49 in the present embodiment include at least end surfaces (surfaces to contact first the second insulating sheet 20) of the projections 48 and 49, but not limited thereto, and portions with a certain distance toward the supporting member 40 from these end surfaces may also be included therein.

As shown in FIG. 4, the second insulating sheet 20, which the stamping surface 4a has been pressed into, is formed therein with concave portions 51 to 57 depending on the shapes of the convex portions 41 to 47 and holes (via holes) 58 and 59 depending on the shapes of the projections 48 and 49.

In this step for pressing the mold 4 against the second insulating sheet 20 (referred also to as a transfer step, hereinafter), as shown in FIG. 4, the length of the projections 48 and 49 and the material and the thickness of the second insulating sheet 20 may be set such that the length h1 (T1) of the projections 48 and 49 formed depending on the via patterns is the thickness h2 (T1) of the second insulating sheet 20 or more at the first set temperature T1 (260° C. to 300° C., for example) (h1 (T1)≥h2 (T1)).

In this transfer step, the second insulating sheet 20 is heated to the first set temperature T1 to expand with a larger thickness h2 than that at ambient temperature (T0), but the end portions 48a and 49a of the projections 48 and 49 are ensured to be exposed at the other main surface side of the second insulating sheet 20 because the length of the projections 48 and 49 and the material and the thickness of the second insulating sheet 20 are preliminarily set such that the length h1 (T1) of the projections 48 and 49 is the thickness h2 (T1) of the second insulating sheet 20 or more at the first set temperature T1 (h1 (T1)≥h2 (T1)).

Figure 5:
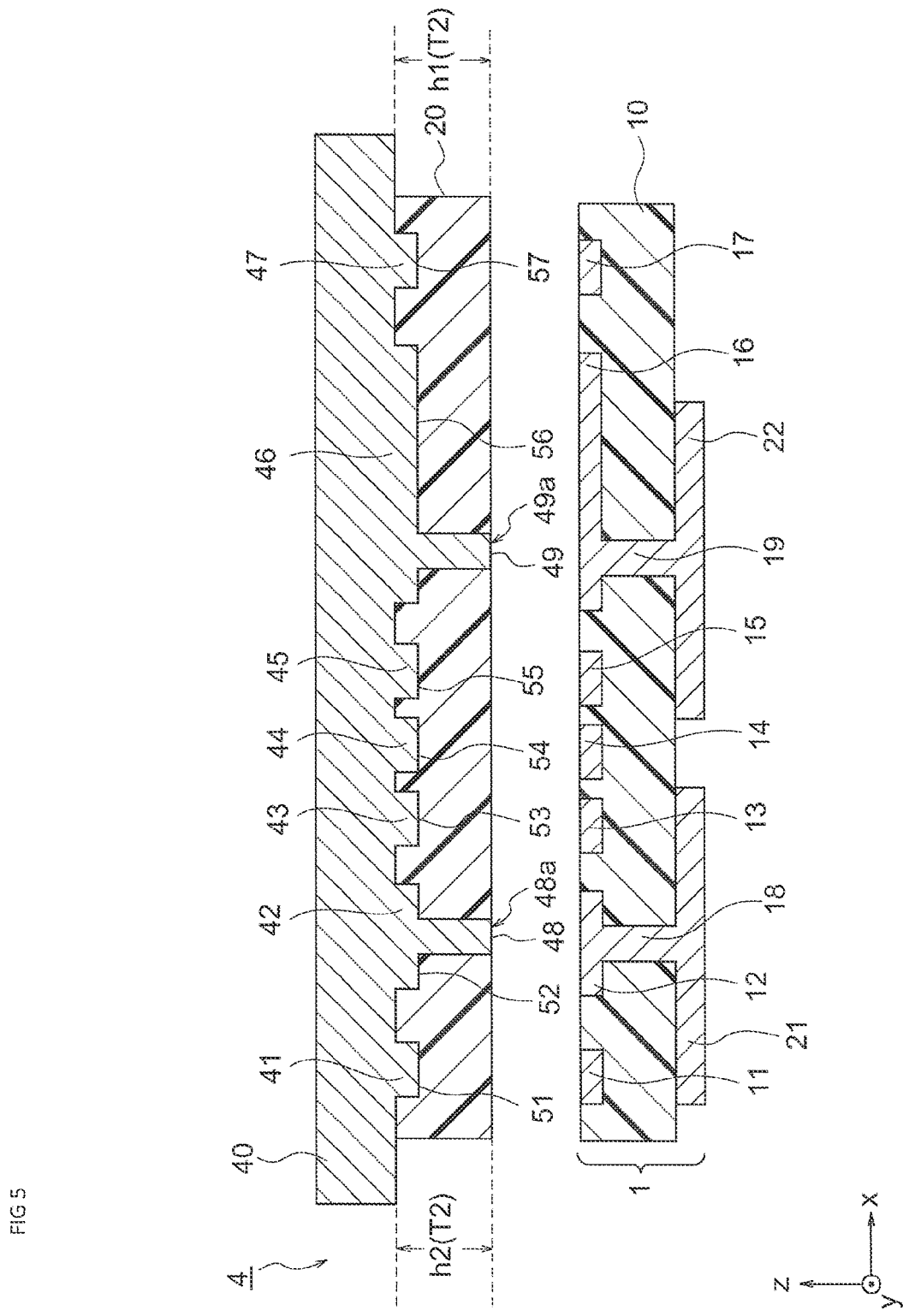
FIG. 5 is a process cross-sectional view illustrating one example of the manufacturing method for the wiring board according to the first embodiment of the first invention.

Subsequently, as shown in FIG. 5, the other main surface (lower surface in the figure) of the second insulating sheet 20 is caused to face the one main surface (upper surface in the figure) of the first substrate 1 in a state where the projections 48 and 49 and the convex portions 41 to 47 of the mold 4 still remain inserted in the second insulating sheet 20. Thereafter, the end portions 48a and 49a of the projections 48 and 49 exposed at the other main surface (lower surface in the figure) of the second insulating sheet 20 are aligned to respectively contact the first upper side wirings 12 and 16 of the first insulating sheet 10 using image recognition, pin-alignment or other appropriate means, and the second insulating sheet 20 is laminated on the first insulating sheet 10, as shown in FIG. 6.

In this laminating step, the second insulating sheet 20 laminated on the one main surface side (upper side in the figure) of the first insulating sheet 10 is hot-pressed along the laminating direction (z-axis direction) while being heated to a second set temperature T2.

The second set temperature T2 in the laminating step may be, such as, but not limited to, a temperature where the first insulating sheet 10 and the second insulating sheet 20 are softened to exhibit adhesiveness. At the second set temperature T2, the first insulating sheet 10 and the second insulating sheet 20 are fused or adhere to each other. The second set temperature T2 may be set as being less than the first set temperature T1, and may be 220° C. to 260° C., for example.

Figure 6:
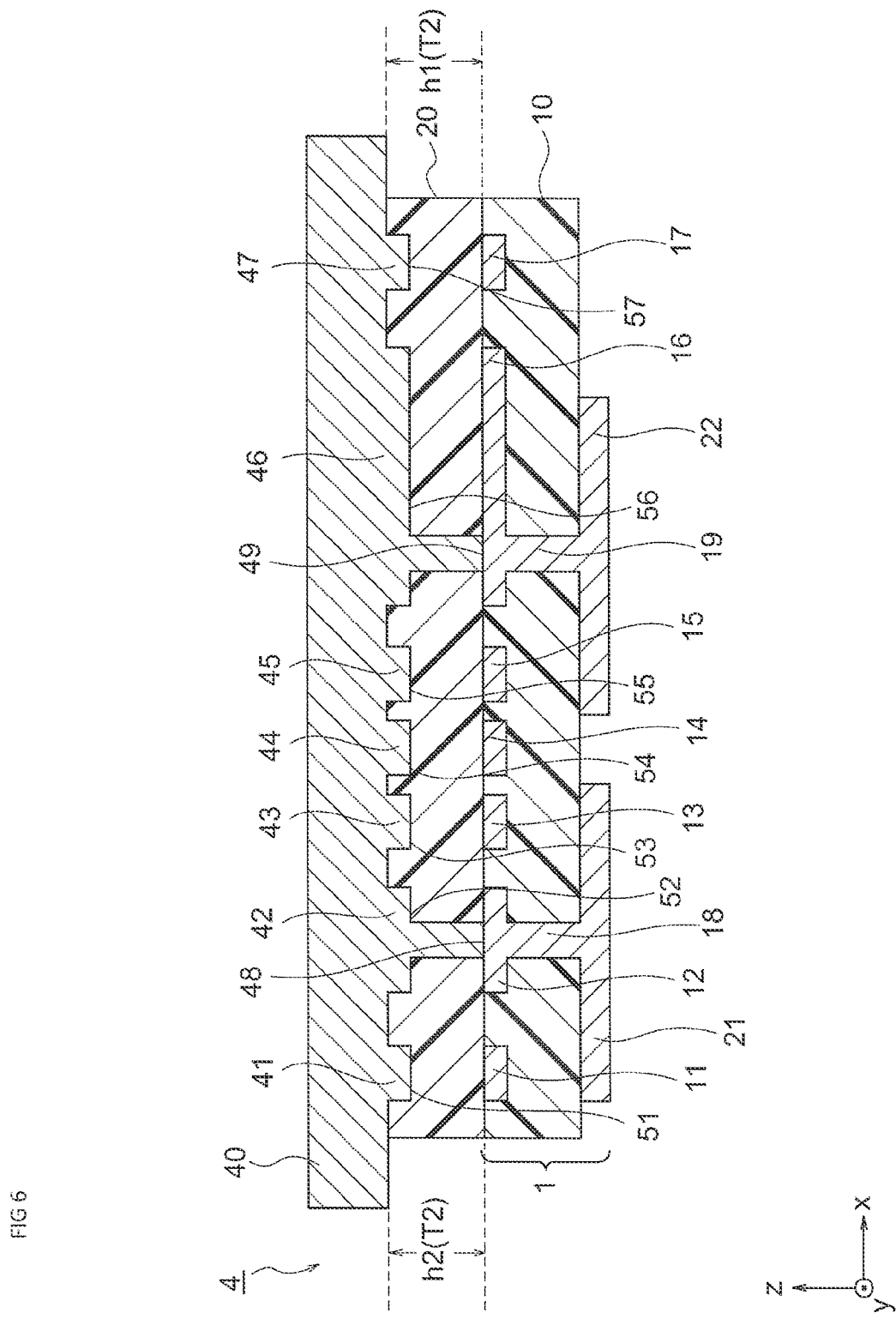
FIG. 6 is a process cross-sectional view illustrating one example of the manufacturing method for the wiring board according to the first embodiment of the first invention.

The end portions 48a and 49a of the projections 48 and 49 longer than the thickness of the second insulating sheet 20 are exposed at the other main surface side (lower side in the figure) of the second insulating sheet 20 before the second insulating sheet 20 is laminated on the first insulating sheet, so that the ends of the projections 48 and 49 and the first upper side wirings 12 and 16 can be ensured to contact each other, respectively, without any resin interposed in the contact portions between the ends of the projections 48 and 49 and the first upper side wirings 12 and 16, as shown in FIG. 6.

In addition, during this laminating step, the height h1 of the projections 48 and 49 formed depending on the second vias 38 and 39 and the thickness h2 of the second insulating sheet 20 can be made to be substantially the same. More specifically, the difference between the length h1 of the projections 48 and 49 and the thickness h2 of the second insulating sheet 20 may be about less than 10% of the length of the projections 48 and 49, preferably less than 5%, more preferably less than 3%, and most preferably less than 1%.

Thus, in the laminating step, the length h1 of the projections 48 and 49 and the thickness h2 of the second insulating sheet 20 are made to be substantially the same thereby to avoid the resin from flowing into the contact portions between the ends of the projections 48 and 49 and the first upper side wirings 12 and 16 even if a part of the second insulating sheet 20 is fluidized due to heating during the laminating. As a result, resin residues can be prevented from remaining between the ends of the projections 48 and 49 and the first upper side wirings 12 and 16. That is, the shapes of the projections 48 and 49 can be transferred to the second insulating sheet 20 without any change, and the second vias 38 and 39 can thus be formed to have the same shapes as the projections 48 and 49. Moreover, in the laminating step, the length h1 of the projections 48 and 49 and the thickness h2 of the second insulating sheet 20 are made to be substantially the same thereby to prevent the ends of the projections 48 and 49 from strongly pressing against the first upper side wirings 12 and 16 to destroy them even if the second insulating sheet 20 is pressed against the first insulating sheet 10 during the laminating.

In fact, the present embodiment is such that the transfer step shown in FIG. 4 is performed at the first set temperature T1 and under the condition where the length h1 (T1) of the projections 48 and 49 of the stamping surface 4a is the thickness h2 (T1) of the second insulating sheet 20 or more while the laminating step shown in FIG. 6 is performed at the second set temperature T2 lower than the first set temperature T1 and under the condition where the length h1 (T2) of the projections 48 and 49 of the stamping surface 4a and the thickness h2 (T2) of the second insulating sheet 20 are substantially the same. Here, the condition, where the thickness of the second insulating sheet 20 is thinner than the length h1 of the projections 48 and 49 at the relatively high first set temperature T1 while the thickness of the second insulating sheet 20 is substantially the same as the length h1 of the projections 48 and 49 at the relatively low second set temperature T2, may appear to be contrary to the common general technical knowledge that the second insulating sheet 20 expands to become thicker as the temperature increases. As shown in FIG. 4, however, even if being applied with a relatively large pressing force during mold clamping in the transfer step, the softened second insulating sheet 20 is allowed to laterally expand toward the outer edge (right and left end portions of the second insulating sheet 20 in the figure). As shown in the figure, the end portions of the second insulating sheet 20 are rounded to absorb the expanded volume of the second insulating sheet. Accordingly, the condition can be established in the present embodiment, where: T1>T2; (the length h1 (T1) of the projections 48 and 49)≥(the thickness h2 (T1) of the second insulating sheet 20); and the length h1 (T2) of the projections 48 and 49 and the thickness h2 (T2) of the second insulating sheet 20 are substantially the same, as described in the above.

After the laminating, the second insulating sheet 20, if being thermosetting resin, is completely cured by being heated for example at 180° C. during one hour using oven or other appropriate means. The second insulating sheet 20, if being thermoplastic resin, is cured by being cooled.

Figure 7:
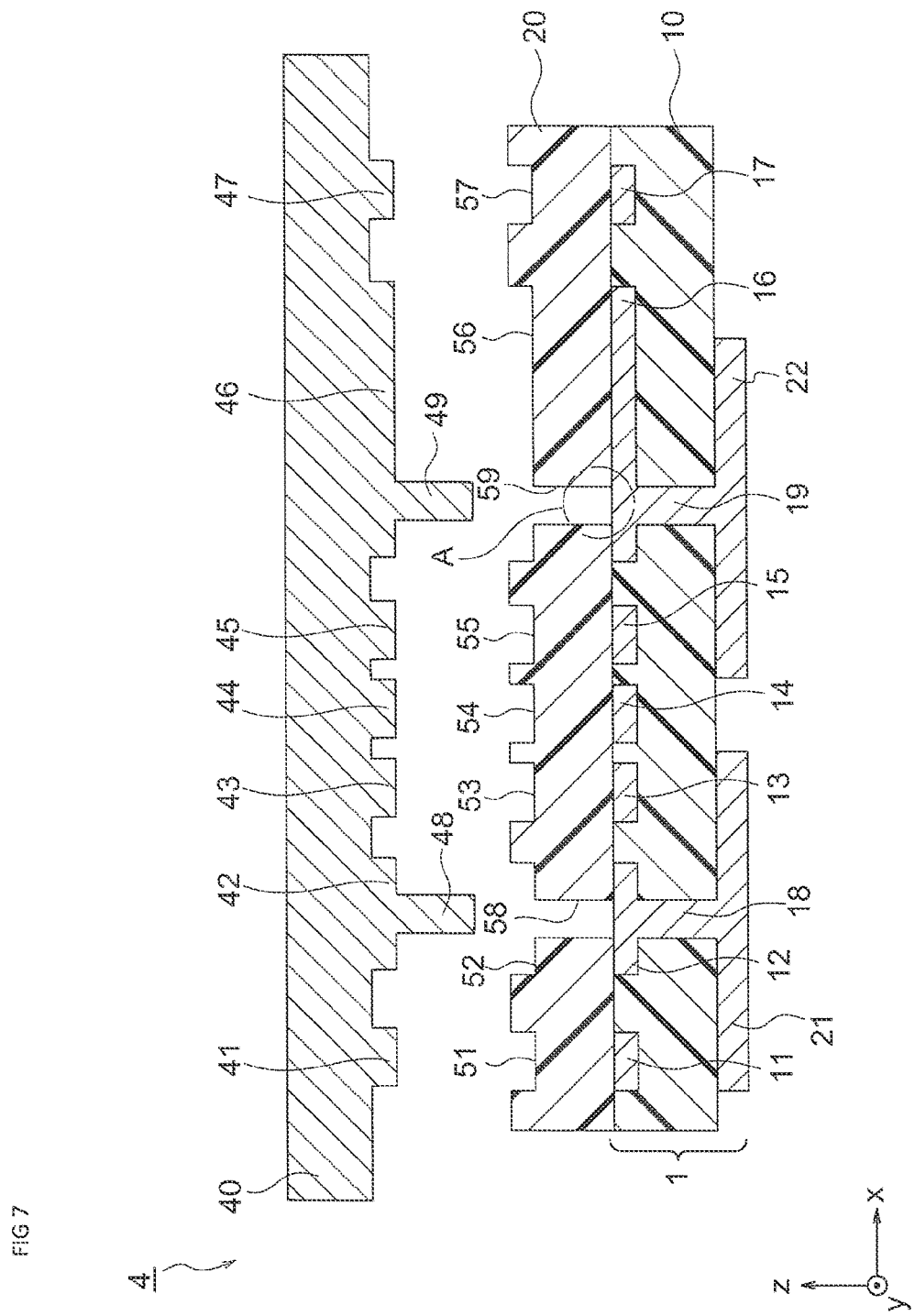
FIG. 7 is a process cross-sectional view illustrating one example of the manufacturing method for the wiring board according to the first embodiment of the first invention.

Subsequently, as shown in FIG. 7, the mold 4 is released from the second insulating sheet 20. This releasing process may be performed after the second insulating sheet 20 is cooled to lower than the glass transition temperature Tg or the heat deformation temperature or cooled to ambient temperature. The second insulating sheet 20 is contracted in the direction of being separated from the stamping surface 4a as the temperature decreases, so that cooling the second insulating sheet 20 assists the releasing, which is an action of causing the stamping surface 4a to be separated from the stamping surface 4a.

Figure 8:
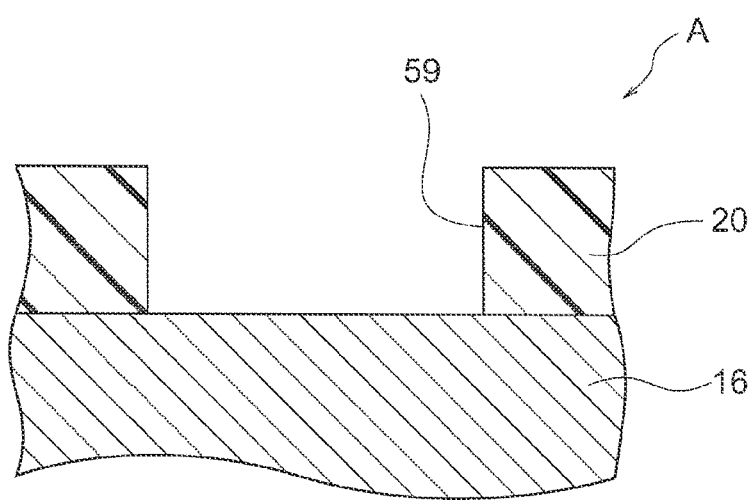
FIG. 8 is an enlarged view of region A shown in FIG. 7.

FIG. 8 is an enlarged view of region A surrounded by broken line in FIG. 7. As shown in FIG. 8, no resin remains on the bottom of a hole 59 having been formed by the projection 49, and the first upper side wiring 16 is exposed without being covered by resin. In this state, a conductive material can be filled in the hole 59 to form the second via 39 which is interlayer-connected with the first upper side wiring 16 without any resin interposed therebetween. That is, the second via 39 can be formed to have the same shape as that of the projection 49 of the mold 4. As a result, the wiring board 100 can be formed to have high connection reliability. In addition, resin residue removing processes are not necessary, such as plasma irradiation, laser irradiation and chemical etching, for removing resin remaining in holes for forming via patterns, which would be required in the conventional method.

If a wiring board is obtained by a manufacturing method including plasma irradiation or laser irradiation, then the patterns and/or the insulating sheets thereof will involve lost parts and/or defect traces, while if a wiring board is obtained by a manufacturing method including chemical etching process, then the patterns and/or the insulating sheets thereof will involve chemical erosion traces. In contrast, according to the manufacturing method of the present embodiment, the wiring board 100 can be provided which can avoid such lost parts, defects or chemical erosions caused due to resin residue removing processes.

Figure 9:
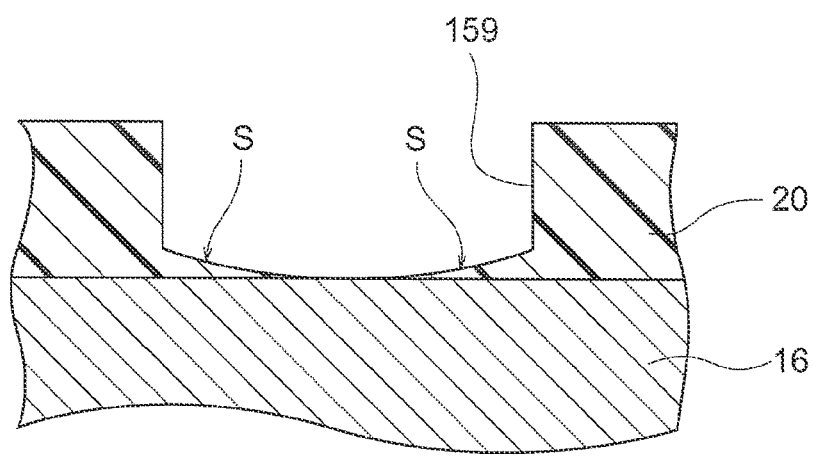
FIG. 9 is an enlarged view of a region, corresponding to the region A shown in FIG. 7, obtained by a manufacturing method according to a comparative example.

In order to confirm advantageous effects resulted from the manufacturing method according to the present embodiment, a manufacturing method according to Comparative Example 1 has been carried out in which the step for pressing the mold 4 against the one main surface of the second insulating sheet 20 is different from the present embodiment only in the point that the length h1 of the projections 48 and 49 is less than the thickness h2 of the second insulating sheet 20, and an observation has also been performed for the condition of the bottom of a hole 159 after the mold 4 was released. FIG. 9 schematically illustrates the condition of a portion in this comparative example, which corresponds to region A. As shown in FIG. 9, resin S remains on the bottom of the hole 159 after the releasing. If, in this condition, a conductive material is filled in the hole 159 to form the second via 39, then the connection reliability will be deteriorated because the resin S remains between the second via 39 and the first upper side wiring 16 thereby to reduce the contact area therebetween.

Similarly, a manufacturing method according to Comparative Example 2 has been carried out in which the step for laminating the second insulating sheet 20 on the first insulating sheet 10 is different from the present embodiment only in the point that the length h1 of the projections 48 and 49 is less than the thickness h2 of the second insulating sheet 20, and an observation has also been performed for the condition of the bottom of a hole 159 after the mold 4 was released. Like the above Comparative Example 1, resin S remains on the bottom of the hole 159 after the releasing. This condition is similar to the condition schematically illustrated in FIG. 9, which corresponds to the previously-described region A in FIG. 7. If, in this condition, a conductive material is filled in the hole 159 to form the second via 39, then the connection reliability will be deteriorated because the resin S remains between the second via 39 and the first upper side wiring 16 thereby to reduce the contact area therebetween.

Finally, a conductive material such as copper (Cu), silver (Ag) or other appropriate material is filled in the concave portions 51 to 57, which correspond to the convex portions 41 to 47 of the mold 4, and the holes 58 and 59, which correspond to the projections 48 and 49 of the mold 4, formed in the second insulating sheet 20, and the wiring board 100 shown in FIG. 1 can thus be obtained. Filling method with a conductive material is not particularly limited, and plating process or screen printing may be employed to fill the conductive material in the concave portions 51 to 57 and the holes 58 and 59.

The plating process may include, such as, but not limited to, applying a resist to the one main surface of the second insulating sheet 20, using photolithography to perform patterning, and plating to fill a metal in the concave portions 51 to 57 and the holes 58 and 59. As the filling method with a conductive material into the concave portions and the holes formed on the one main surface of the second insulating sheet 20, any known method in the art at the time of filing this application may freely be used. Thereafter, excess portions of the conductive material may be removed by polishing, etching or other appropriate means.

As heretofore described, according to the manufacturing method for the wiring board 100 in the present embodiment of this invention, the end portions 48a and 49a of the projections 48 and 49 are exposed at the lower surface side of the second insulating sheet 20 when the second insulating sheet 20 is laminated on the first insulating sheet 10, thereby ensuring the second vias 38 and 39 and the first upper side wirings 12 and 16 to respectively be connected with each other, and the wiring board 100 can thus be produced which has high connection reliability.

<Second Embodiment of First Invention>

A second embodiment of the first invention will hereinafter be described with reference to FIG. 10 to FIG. 12. The present embodiment is characterized in that a cushion sheet (cushion member) 60 is located on the other main surface side of the second insulating sheet 20 in the transfer step in the first embodiment of the first invention. In order to avoid redundant descriptions, different aspects from the first embodiment will hereinafter be focused, and descriptions for common entities will be represented by those for the first embodiment of the first invention.

Figure 10:
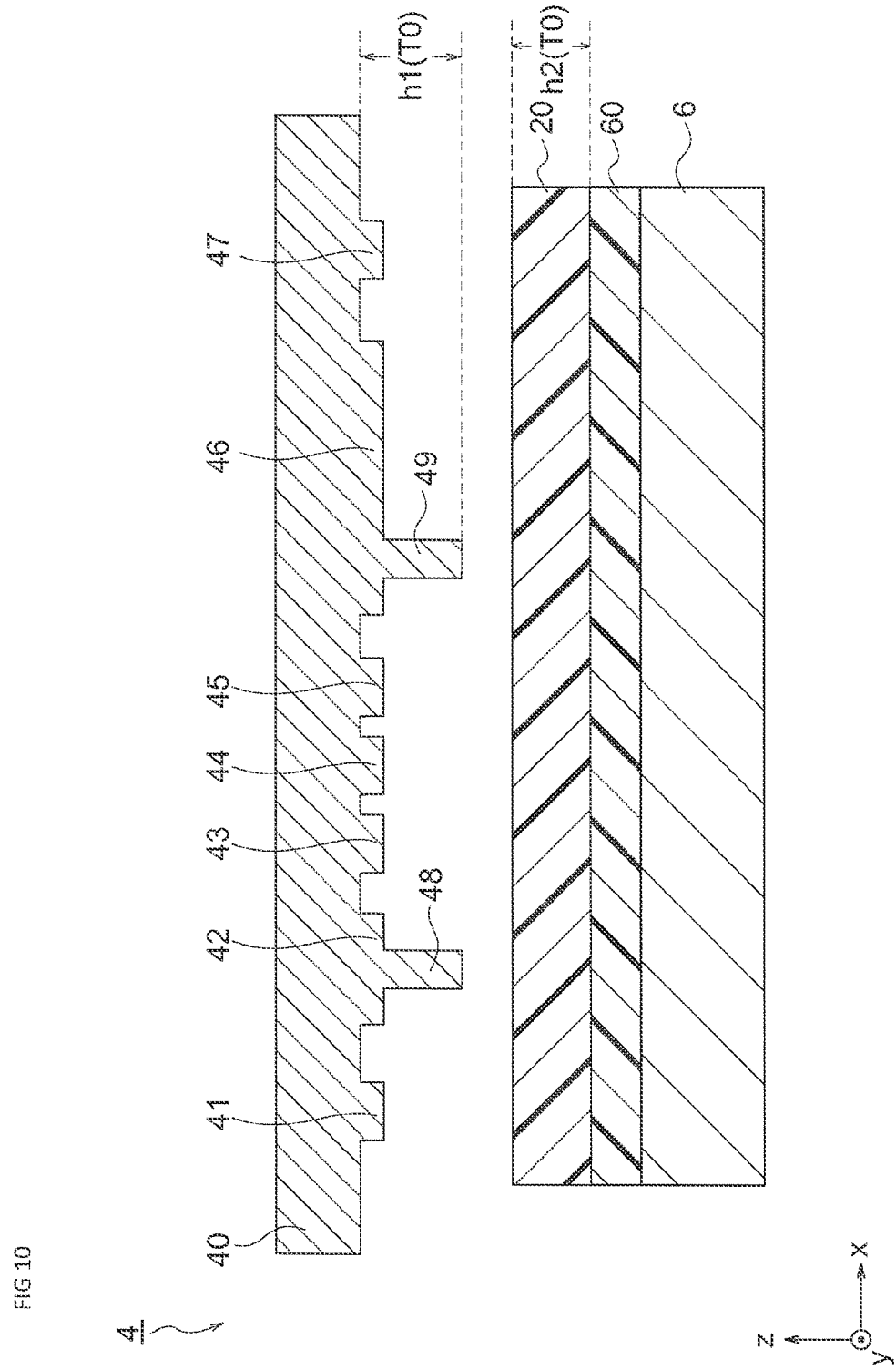
FIG. 10 is a process cross-sectional view illustrating one example of a manufacturing method for a wiring board according to a second embodiment of the first invention.

FIG. 10 is a process cross-sectional view which illustrates a set condition before the transfer step and which corresponds to FIG. 3 in the first embodiment. As shown in FIG. 10, in the present embodiment, the cushion member 60 which has elasticity is located on the other main surface side (lower surface side in the figure) of the second insulating sheet 20. As the cushion member 60, a film or a porous member may be used, such as made of thermoplastic resin, polyethylene terephthalate (PET), polytetrafluoroethylene (PTFE) or fluorine resin.

Under a similar condition to the first embodiment, i.e. under the first set temperature T1, the stamping surface 4a of the mold 4 is pressed against the second insulating sheet 20. In this transfer step, the length h1 (T1) of the projections 48 and 49 is set as being larger than the thickness h2 (T1) of the second insulating sheet 20.

Figure 11:
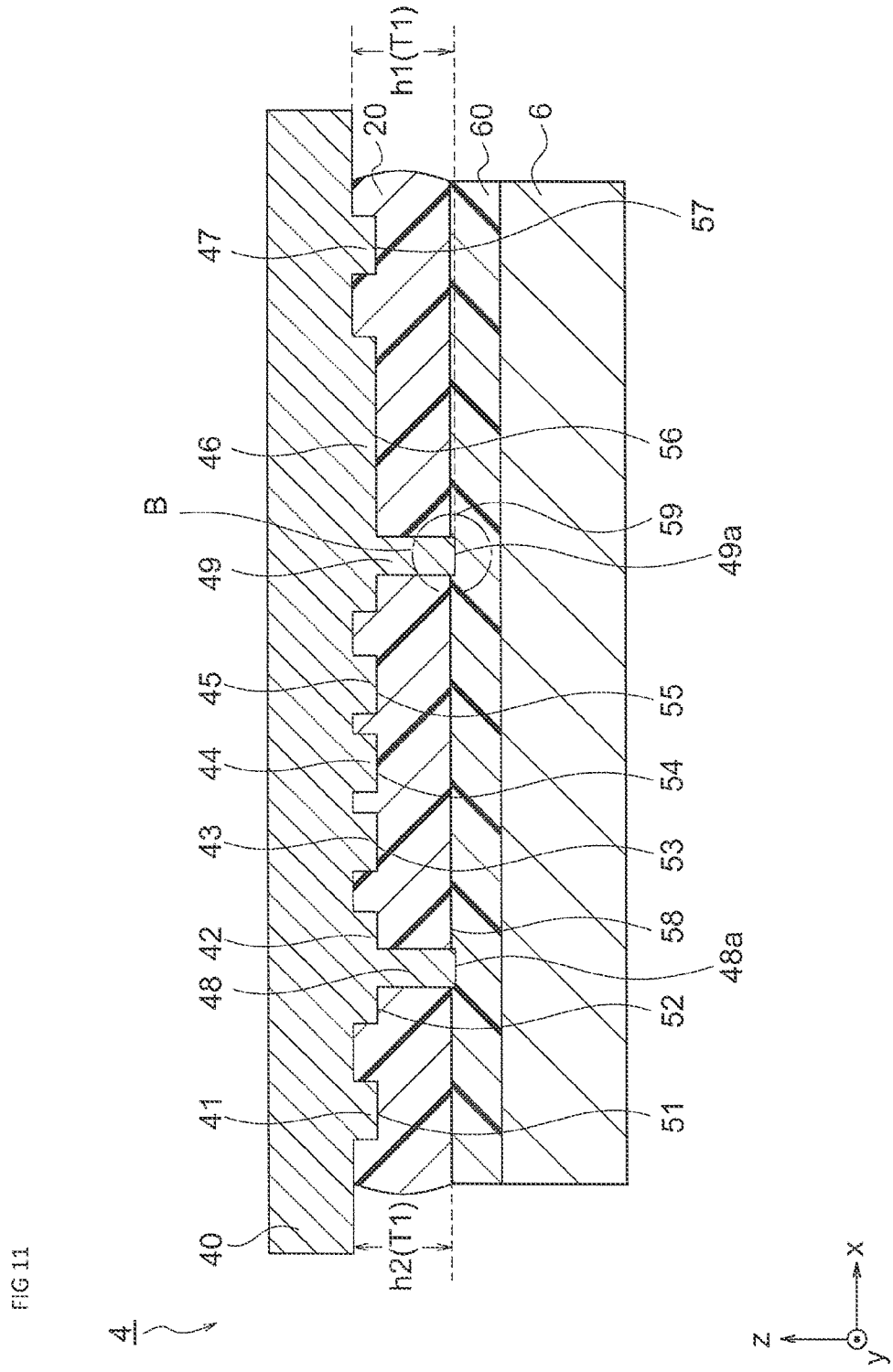
FIG. 11 is a process cross-sectional view illustrating one example of the manufacturing method for the wiring board according to the second embodiment of the first invention.
Figure 12:
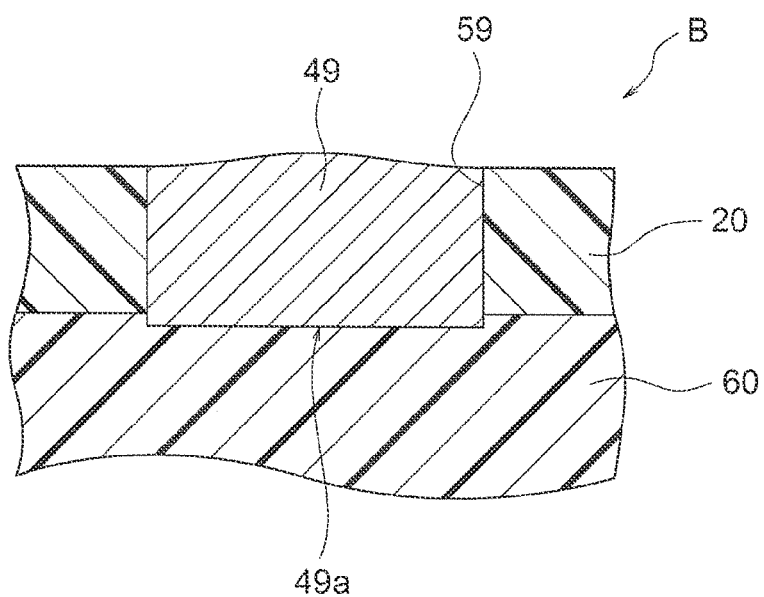
FIG. 12 is an enlarged view of region B shown in FIG. 11.

As shown in FIG. 11, in the transfer step, the end portions 48a and 49a of the projections 48 and 49 are exposed at the other main surface side (lower surface side in the figure) of the second insulating sheet 20, and these exposed end portions 48a and 49a press against the cushion member 60. The cushion member 60 is pressed by the end portions 48a and 49a to be depressed and deforms along the shapes of the end portions 48a and 49a. An enlarged view of region B of FIG. 11 in this state is shown in FIG. 12. As shown in FIG. 12, the end portion 49a is exposed at the other main surface of the second insulating sheet 20 and further sinks into the cushion member 60.

Thus, the cushion member 60 having elasticity is located on the other main surface side (lower surface side in the figure) of the second insulating sheet 20 thereby allowing the end portions 48a and 49a to penetrate the second insulating sheet 20 even with small force.

Particularly, if, in the transfer step of the present embodiment, the length h1 (T1) of the projections 48 and 49 is set as being the thickness h2 (T1) of the second insulating sheet 20 or more under the first set temperature T1 while, in the laminating step, the length h1 (T2) of the projections 48 and 49 and the thickness h2 (T2) of the second insulating sheet 20 are set as being substantially the same under the second set temperature T2, then high accuracy is required for the control of the material, the thickness and the temperature of the second insulating sheet 20 and the length of the projections 48 and 49. Given such a situation, even in the case where some variation occurs in the relationship between the length h1 of the projections 48 and 49 and the thickness h2 of the second insulating sheet 20, if the cushion member 60 is located, then the pressing force to the second insulating sheet 20 in the transfer step can be controlled to thereby expose the end portions 48a and 49a of the projections 48 and 49 at the other main surface side of the second insulating sheet 20.

As described in the above, according to the manufacturing method for the wiring board 100 in the second embodiment of the first invention, similar actions and advantageous effects to those in the first embodiment can be obtained, and in addition to this, the projections 48 and 49 can be exposed at the other main surface side of the second insulating sheet 20 with relatively small force because the cushion member 60 is located on the other main surface side of the second insulating sheet 20 in the transfer step. Moreover, even if a variation occurs in the relationship between the length h1 of the projections 48 and 49 and the thickness h2 of the second insulating sheet 20, such a variation will be absorbed and the projections 48 and 49 can thus be ensured to expose at the other main surface side of the second insulating sheet 20.

<First Embodiment of Second Invention>

Hereinafter, a manufacturing method for wiring board 100 according to the first embodiment of the second invention will be described.

An object of the second invention is to provide a manufacturing method for the wiring board 100 in which resin residues are unlikely to remain on the contact areas of via patterns. Further, the second invention is for the purpose of providing a manufacturing method for the wiring board 100 in which the filling process can be omitted, which would be necessary for an imprint method.

In order to achieve highly-dense wiring in association with downsizing electronic devices and enhancing the functionality thereof, an imprint method is known in which a mold is used to transfer concave shapes to an insulating sheet and the concave shapes are filled with a conductive material to form fine patterns (such as wiring patterns and via patterns).

In this imprint method, after the mold is released from the insulating sheet, if some resin remains in opening areas which have been formed by the mold and are to be connection portions for via patterns, then connection failures in via patterns or other troubles may possibly occur. In this respect, there is known an approach for removing such resin residues in opening areas using plasma etching or laser ablation (Patent Document 1: U.S. Pat. No. 7,351,660).

However, if, in order to remove resin residues, plasma or laser light is irradiated to a substrate formed thereon with wiring patterns, then problems occur including that the wiring patterns may be damaged or partially lost.

Problems to be solved by the present invention include avoiding resin from remaining between via patterns and wiring patterns contacting therewith, during the formation of via patterns.

The configuration of the wiring board 100 obtained by the manufacturing method according to the first embodiment of the present invention will first be described with reference to FIG. 13, and the manufacturing method according to the first embodiment of the present invention will then be described with reference to FIG. 14 to FIG. 19.

(Configuration of Wiring Board)

Figure 13:
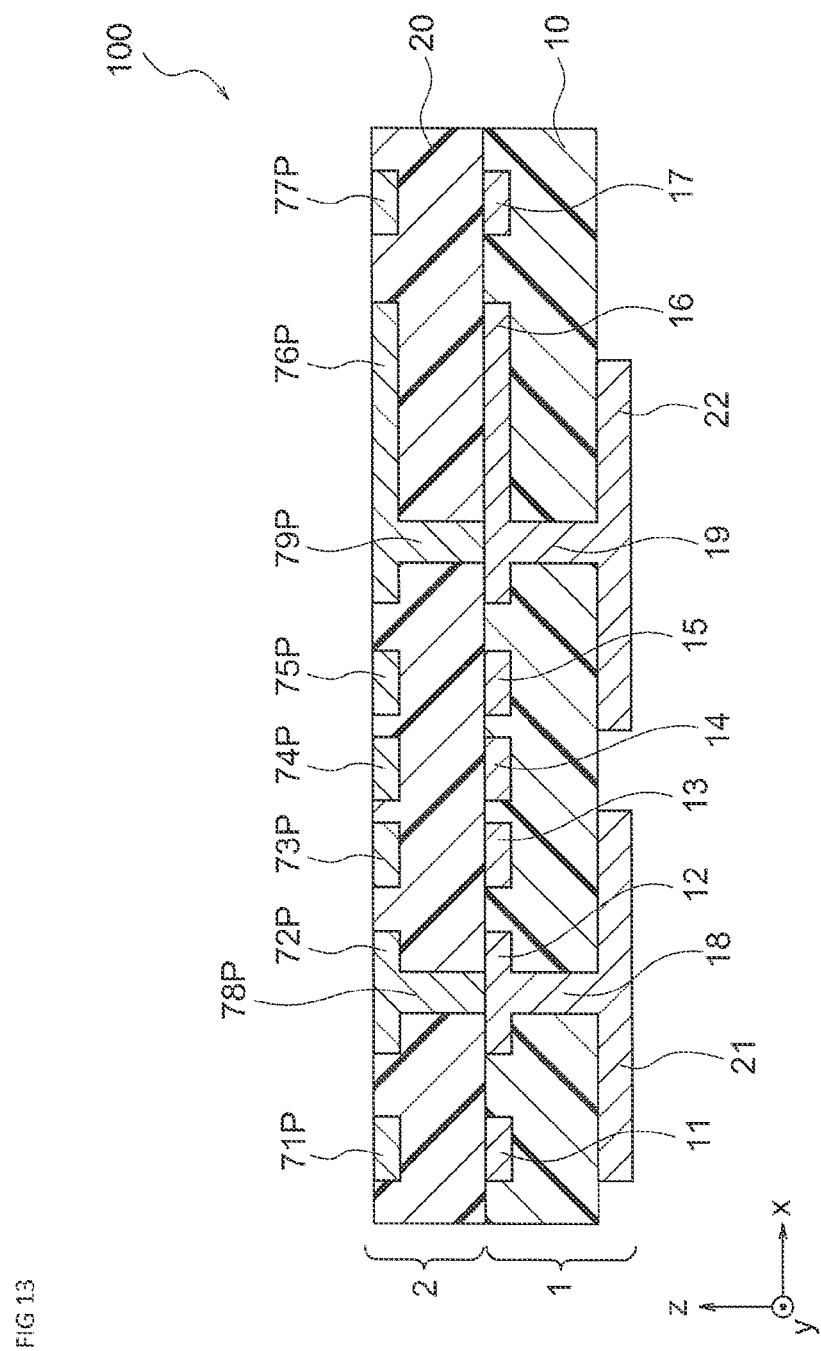
FIG. 13 is a cross-sectional view illustrating one example of a wiring board according to a first embodiment of the second invention.

As shown in FIG. 13, the wiring board 100 according to the first embodiment of the second invention is a multilayer board that comprises a first substrate 1 and a second substrate 2 laminated on one main surface side (upper side in the figure) of the first substrate 1. While the present embodiment is described for an example of the wiring board 100 which is configured of two substrates, the pre sent invention is applicable to a wiring board 100 which is configured of three or more substrates. Note that the present embodiment is described with reference to an x-y plane shown in the figure as a plane along the wiring board 100 (substrates 1 and 2 and insulating sheets 10 and 20) and a z-axis direction as the laminating direction, and the upper side along the z-axis in the figure represents the one main surface side.

The first substrate 1 located on the lower side in the figure comprises: a first insulating sheet 10; first upper side wirings 11 to 17 formed on one main surface (the upper side in the figure: here and hereinafter) of the first insulating sheet 10; first lower side wirings 21 and 22 formed on the other main surface (the lower side in the figure: here and hereinafter) of the first insulating sheet 10; and first vias 18 and 19 respectively connecting the first upper side wirings 12 and 16 and the first lower side wirings 21 and 22.

The second substrate 2 comprises: a second insulating sheet 20 laminated on the one main surface (the upper side in the figure) of the first insulating sheet 10; second upper side wirings 71P to 77P formed on one main surface (main surface on the upper side in the figure) of the second insulating sheet 20; and second vias 78P and 79P respectively connecting the second upper side wirings 72P and 76P and the first upper side wirings 12 and 16, wherein the second upper side wirings 72P and 76P are included in the second upper side wirings 71P to 77P.

The second upper side wirings 71P to 77P and the second vias 78P and 79P are convexly formed toward the interior of the second insulating sheet 20 from the one main surface (the upper side main surface) of the second insulating sheet 20. That is, the one main surface of the second insulating sheet 20 formed with the second upper side wirings 71P to 77P and connection portions for the second vias 78P and 79P is flat, so that another substrate not shown can be laminated flatly thereon, i.e. without any space, or other electric components not shown can be mounted thereon.

As a material for the first insulating sheet 10 and the second insulating sheet 20, thermosetting resin such as epoxy resin or thermoplastic resin such as thermoplastic polyimide and liquid-crystal polymer may be used, for example. As a material for the first upper side wirings 11 to 17, the first lower side wirings 21 and 22, the first vias 18 and 19, the second upper side wirings 71P to 77P and the second vias 78P and 79P, copper (Cu), silver (Ag), gold (Au) or other materials having conductivity may be used.

Although not particularly limited, in the first upper side wirings 11 to 17 and the first lower side wirings 21 and 22 constituting a part of wiring patterns of the first substrate 1 and the second upper side wirings 71P to 77P constituting a part of wiring patterns of the second substrate 2, line-and-space areas may be arranged such that the wiring width is approximately 5 μm to 15 μm and the wiring space is approximately 5 μm to 15 μm. In addition, the diameter (thickness) of the first vias 18 and 19 and the second vias 78P and 79P is 2 μm or more and 35 μm or less, preferably 2 μm or more and 15 μm or less, and more preferably 2 μm or more and less than 10 μm. The length of the first vias 18 and 19 and the second vias 78P and 79P in the present embodiment is 1 μm or more and 50 μm or less, and preferably 10 μm or more and 40 μm or less. The aspect ratio is 0.5 to 25 and preferably 1 to 25, and may be about 1 to 4 in the present example.

(Manufacturing Method for Wiring Board)

One example of a manufacturing method for the wiring board 100 according to the first embodiment of the second invention will then be described with reference to FIG. 14 to FIG. 19.

Figure 14:
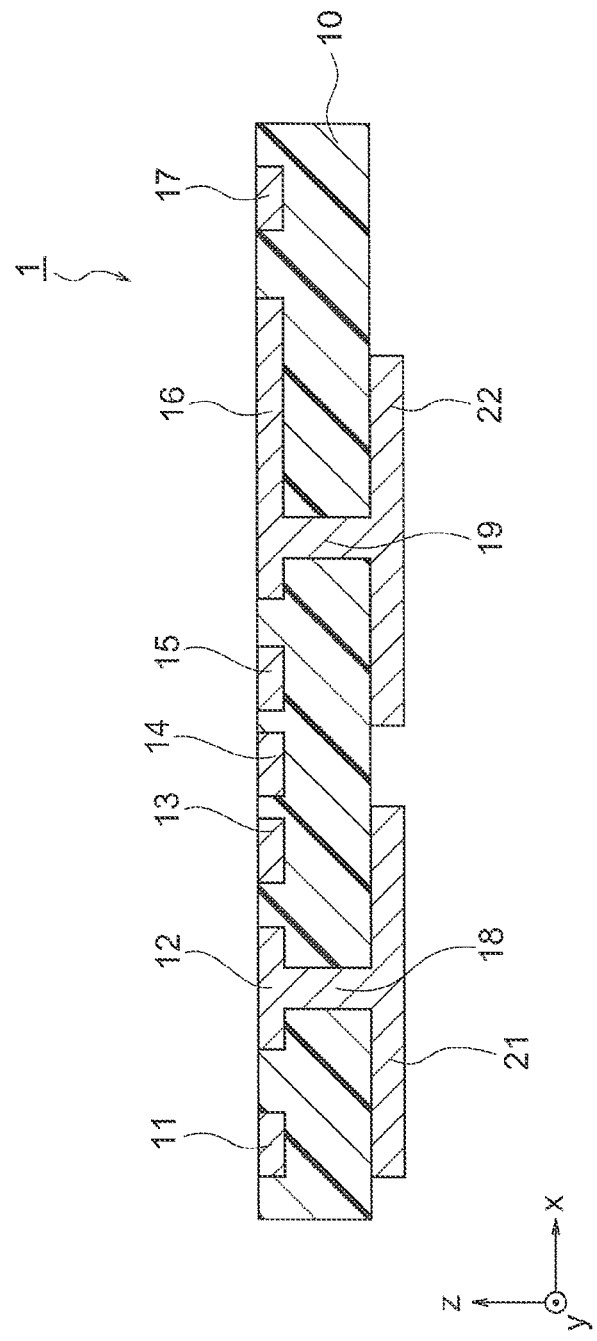
FIG. 14 is a process cross-sectional view illustrating one example of a manufacturing method for the wiring board according to the first embodiment of the second invention.

At first, the first substrate 1 shown in FIG. 14 is prepared. As the first substrate 1, a substrate may be used which comprises at least the first insulating sheet 10 and the first upper side wirings 11 to 17 formed on one main surface (surface on which the second substrate 2 is to be laminated) of the first insulating sheet 10, but in the present example, a double-side substrate is used as the first substrate 1, in which the first upper side wirings 11 to 17 are formed on the one main surface of the first insulating sheet 10 so as to be embedded therein and the first lower side wirings 21 and 22 are formed on the other main surface.

While the product ion method for the first substrate 1 shown in FIG. 14 is not particularly limited, a mold is used for example, which comprises a stamping surface including convex portions and projections formed respectively depending on the first upper side wirings 11 to 17 and the first vias 18 and 19, to transfer patterns to the one main surface (upper surface in the figure) of the first insulating sheet 10 thereby forming concave portions and holes respectively depending on the first upper side wirings 11 to 17 and the first vias 18 and 19, a plating process or other appropriate process is performed to fill these concave portions and holes with a conductive material, and the first substrate 1 can thereby be produced as a single-side substrate, in which the first upper side wirings 11 to 17 and the first vias 18 and 19 are formed on the one main surface side of the first insulating sheet 10. Further, a resist is applied to the other main surface (lower surface in the figure) of the first insulating sheet 10, photolithography is used to pattern the resist depending on the first lower side wirings 21 and 22, plating is then performed, and the first substrate 1 can thereby produced as a double-side substrate, in which the first lower side wirings 21 and 22 are further formed on the other main surface side of the first insulating sheet 10. Of course, both surfaces may be formed thereon with resists having certain patterns, and thereafter a plating process may be concurrently performed for the both surfaces.

Alternatively, holes depending on the first vias 18 and 19 are formed by irradiating laser beam or other beam to the one main surface (upper surface in the figure) side of the first insulating sheet 10, thereafter, photolithography is used to pattern a resist depending on patterns of the first upper side wirings 11 to 17 and the first vias 18 and 19, concave portions depending on the first upper side wirings 11 to 17 and the holes depending on the first vias 18 and 19 are subjected to nonelectrolytic plating and/or electrolytic plating, and the first substrate 1 can thereby be produced as a single-side substrate, in which the first upper side wirings 11 to 17 and the first vias 18 and 19 are formed on the one main surface side of the first insulating sheet 10. Note that the plating may be substituted by screen printing which uses conductive paste to fill a conductive material in concave portions depending on the first upper side wirings 11 to 17 and in holes depending on the first vias 18 and 19. Further, the first substrate formed thereon with the first lower side wirings 21 and 22 can be produced by printing conductive paste to the other main surface (lower surface in the figure) side of the first insulating sheet 10 using a printing plate depending on patterns of the first lower side wirings 21 and 22. As the production method for the first substrate 1, any production method for double-side substrate known in the art at the time of filing this application may appropriately be utilized. If no wiring pattern is necessary for the other main surface side of the first substrate 1, then any production method for single-side substrate known in the art at the time of filing this application may appropriately be utilized.

Figure 15:
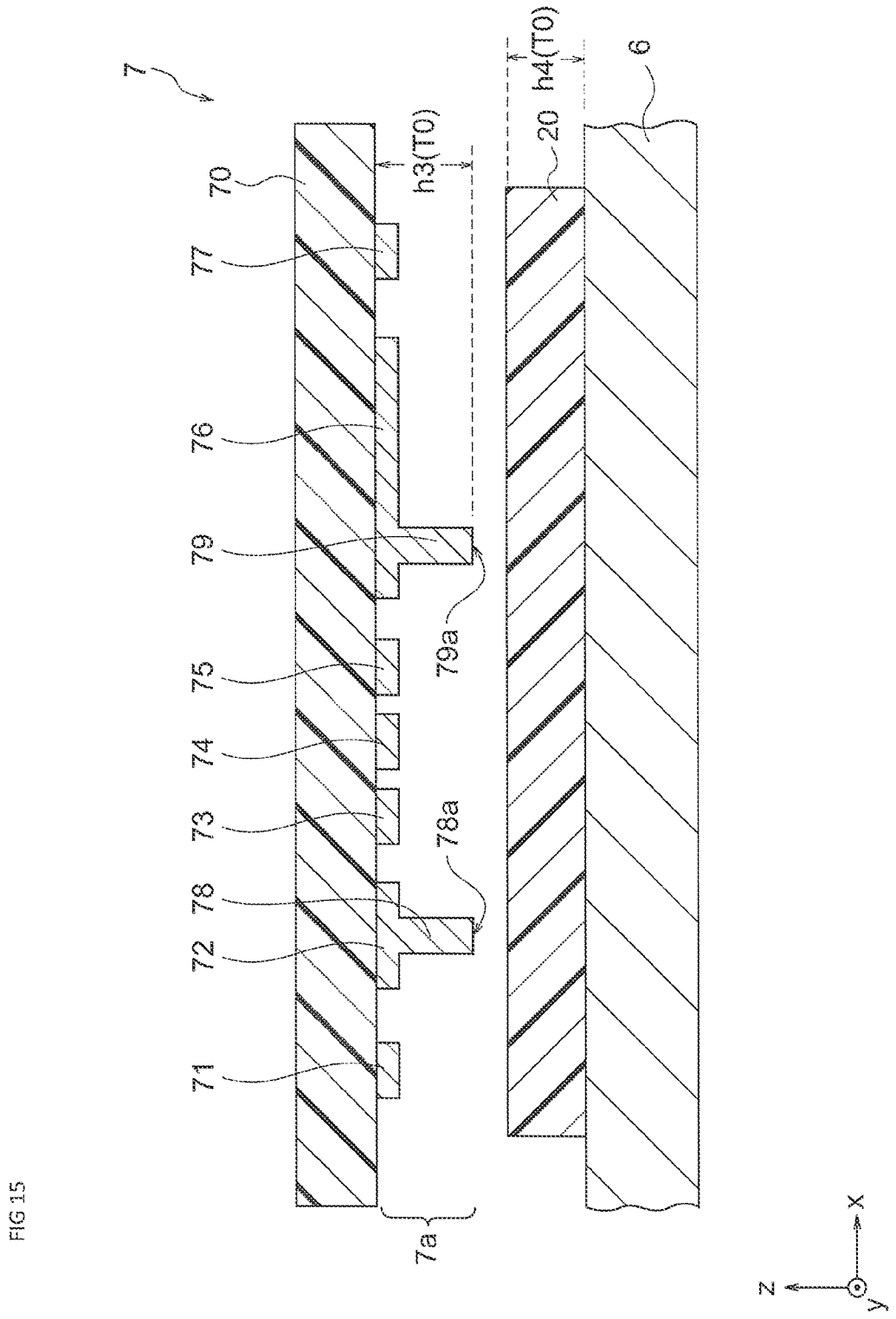
FIG. 15 is a process cross-sectional view illustrating one example of the manufacturing method for the wiring board according to the first embodiment of the second invention.

Before or after or in parallel with the preparation of the first substrate 1, a wiring body 7 shown in FIG. 15 is prepared. As shown in FIG. 15, the wiring body 7 in the present embodiment has a wiring surface 7a that includes: convex portions 71 to 77 functioning as the second upper side wirings 71P to 77P to be a part of patterns of the second substrate 2 which will be laminated on the first substrate 1 in the wiring board 100 as a product; and projections 78 and 79 functioning as the second vias 78P and 79P to be another part of the patterns.

The convex portions 71 to 77 and the projections 78 and 79 of the wiring surface 7a constitute respectively the second upper side wirings 71P to 77P themselves and the second vias 78P and 79P themselves in the wiring board 100 as a product, and function as a working-purpose plate (original plate) for forming a concave-convex shape (the projections 78 and 79 and the convex portions 71 to 77), which depends on shapes of these second vias 78P and 79P and the second upper side wirings 71P to 77P, on the second insulating sheet 20. Reference character 7a in FIG. 15 specifies the entire surface to be pressed against the second insulating sheet, on the other main surface side (lower side in the figure) of the wiring body 7 formed thereon with the concave-convex shape including the convex portions 71 to 77 and projections 78 and 79 for constituting desired patterns.

While the production method for the wiring body 7 is not particularly limited, the wiring body 7 can be obtained for example through: preparing a mold provided with concaves and convexes depending on wiring portions including the convex portions 71 to 77 and the projections 78 and 79; filling regions among these concaves and convexes with a conductive material such as copper (Cu), gold (Au), silver (Ag) or nickel (Ni) by plating or printing; thereafter performing solidification; and applying them to the supporting member 70.

Note that the mold for producing the convex portions 71 to 77 of the wiring portions may be obtained, such as, but not limited to, by the following approach. For example, a mold provided with concave portions depending on the convex portions 71 to 77 and holes depending on the projections 78 and 79 can be obtained through: preparing a resin plate body applied to a main surface of a supporting plate body for producing a mold; irradiating laser or electron beam or performing etching process to a main surface of the resin plate body to form holes depending on the second vias 78P and 79P; laminating a resist layer on the resin plate body; and exposing or heating predetermined regions of the resist layer depending on wiring patterns and thereafter selectively removing the predetermined regions using etching liquid to form groove portions depending on the wiring patterns.

The production method for the wiring body 7 is not limited to the above, and the convex portions 71 to 77 and the projections 78 and 79 can be formed on the main surface of the supporting member 70 using a method for forming wiring patterns known in the art at the time of filing this application. For example, screen printing may be employed using ink including a conductive material to form the convex portions 71 to 77 and the projections 78 and 79 on the other main surface (lower surface in the figure) of the supporting member 70, or plating process may be performed for concave portions of a mask removed therefrom predetermined regions using photolithography thereby to form the convex portions 71 to 77 and the projections 78 and 79.

As shown in FIG. 15, the wiring body 7 is located so that the wiring surface 7a faces a stage 6, on which a target object to be transferred thereto is to be placed. As shown in the figure, if the second insulating sheet 20 is set on the platen of the stage 6, then the wiring surface 7a of the wiring body 7 faces the one main surface side (upper side in the figure) of the second insulating sheet 20. Although not particularly limited, as the second insulating sheet 20, uncured (semi-cured) thermosetting resin such as epoxy resin or thermoplastic resin such as liquid-crystal polymer or thermoplastic polyimide may be used, for example.

As shown in FIG. 15, in a state at ambient temperature (T0) before mold clamping, the depth of the wiring surface 7a, in particular the length h3 (T0) of the projections 78 and 79 formed on the wiring surface 7a depending on the second vias 78P and 79P, may be set as being the thickness h4 (T0) of the second insulating sheet 20 or more. The second insulating sheet 20 tends to expand in the subsequent heating process to increase in its thickness h4, and therefore, the thickness h4 (T0) of the second insulating sheet 20 at ambient temperature is preferred to be set as being equal to or thinner than the depth of the wiring surface 7a.

Using the above-described wiring body 7 shown in FIG. 15, the second substrate 2 is obtained. Specifically, the second insulating sheet 20 is heated at first until it becomes a first set temperature T1. The first set temperature T1 is a temperature which is suitable for transferring the wiring surface 7a and which is defined depending on the heat deformation temperature or glass transition temperature (Tg) of the second insulating sheet 20. The first set temperature T1 when the pattern shape of the wiring surface 7a is transferred may be freely determined depending on the characteristics and the thickness of the second insulating sheet 20. As one example, the first set temperature T1 may be approximately 260° C. to 300° C. Note that heating the second insulating sheet 20 may be performed by directly heating the second insulating sheet 20 or by heating the wiring body 7 to indirectly heat the second insulating sheet which contacts the wiring body 7.

Figure 16:
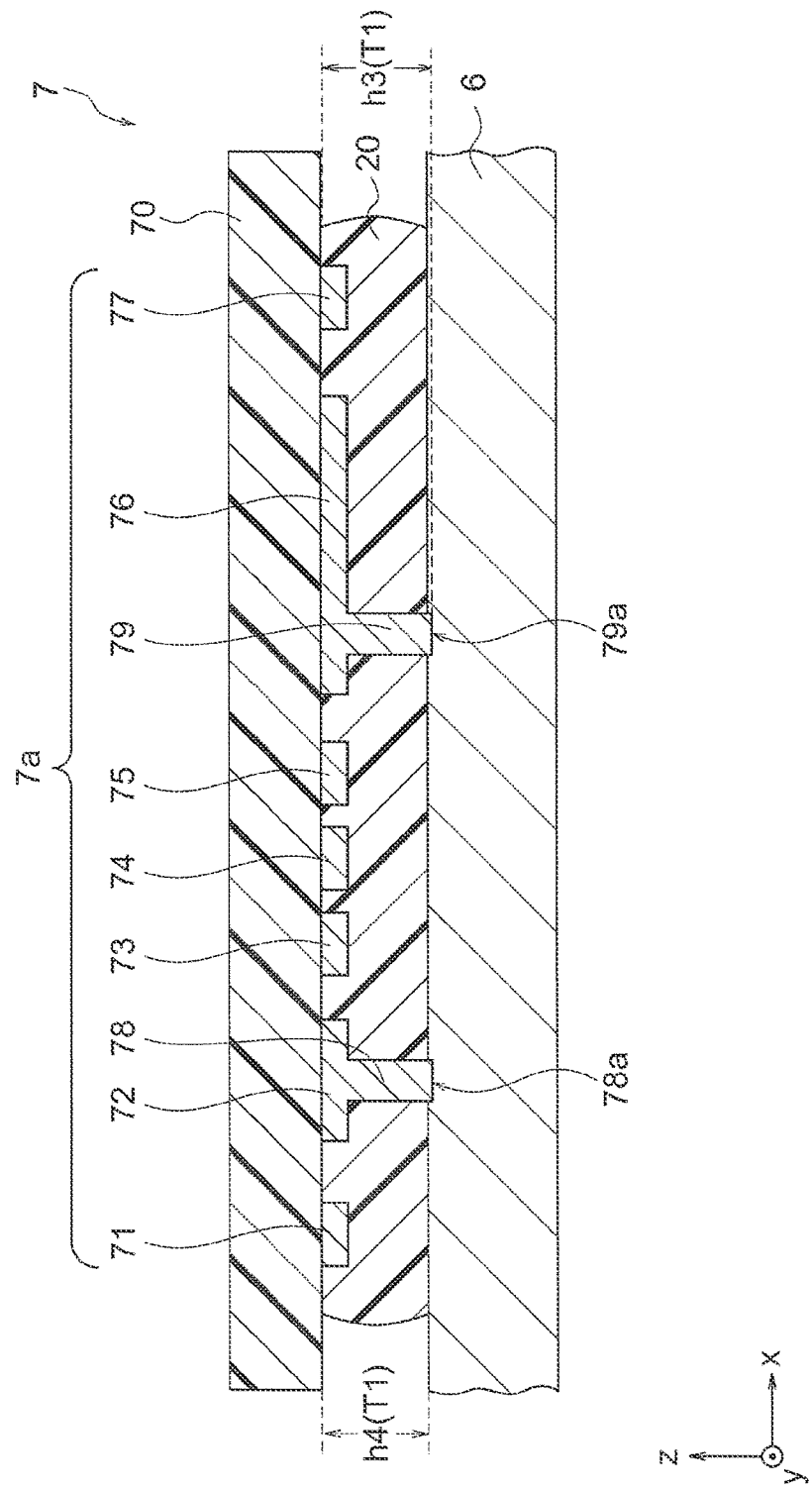
FIG. 16 is a process cross-sectional view illustrating one example of the manufacturing method for the wiring board according to the first embodiment of the second invention.

As shown in FIG. 16, after the second insulating sheet 20 is heated to the first set temperature T1 (or after the wiring body 7 is heated to a temperature capable of heating the second insulating sheet 20 to the first set temperature T1 at the time of transferring), the wiring surface 7a of the wiring body 7 is pressed against the second insulating sheet 20.

The projections 78 and 79 and the convex portions 71 to 77 of the wiring surface 7a are pressed into the second insulating sheet 20 having been heated to be softened. In the present embodiment, the wiring body 7 may be pressed against the one main surface (upper side in the figure) of the second insulating sheet 20 so that at least end portions 78a and 79a of the projections 78 and 79 of the wiring surface 7a are exposed at the other main surface side (lower side in the figure) of the second insulating sheet 20. The end portions 78a and 79a of the projections 78 and 79 in the present embodiment include at least end surfaces (surfaces to contact first the second insulating sheet 20) of the projections 78 and 79, but not limited thereto, and portions with a certain distance toward the supporting member 70 from these end surfaces may also be included therein.

As shown in FIG. 16, the convex portions 71 to 77 depending on the second upper side wirings 71P to 77P and the projections 78 and 79 depending on the second vias 78P and 79P are formed on the one main surface of the second insulating sheet 20 in a state of being embedded therein.

In this step for pressing the wiring body 7 against the second insulating sheet 20 (referred also to as an embedding step, hereinafter), as shown in FIG. 6, the length of the projections 78 and 79 and the material and the thickness of the second insulating sheet 20 may be set such that the length h3 (T1) of the projections 78 and 79 formed depending on the second vias 78P and 79P is the thickness h4 (T1) of the second insulating sheet 20 or more at the first set temperature T1 (260° C. to 300° C., for example) (h3 (T1)≥h4 (T1)).

In this embedding step, the second insulating sheet 20 is heated to the first set temperature T1 to expand with a larger thickness h4 than that at ambient temperature (T0), but the end portions 78a and 79a of the projections 78 and 79 are ensured to be exposed at the other main surface side of the second insulating sheet 20 because the length of the projections 78 and 79 and the material and the thickness of the second insulating sheet 20 are preliminarily set such that the length h3 (T1) of the projections 78 and 79 is the thickness h4 (T1) of the second insulating sheet 20 or more at the first set temperature T1 (h3 (T1)≥h4 (T1)).

Figure 17:
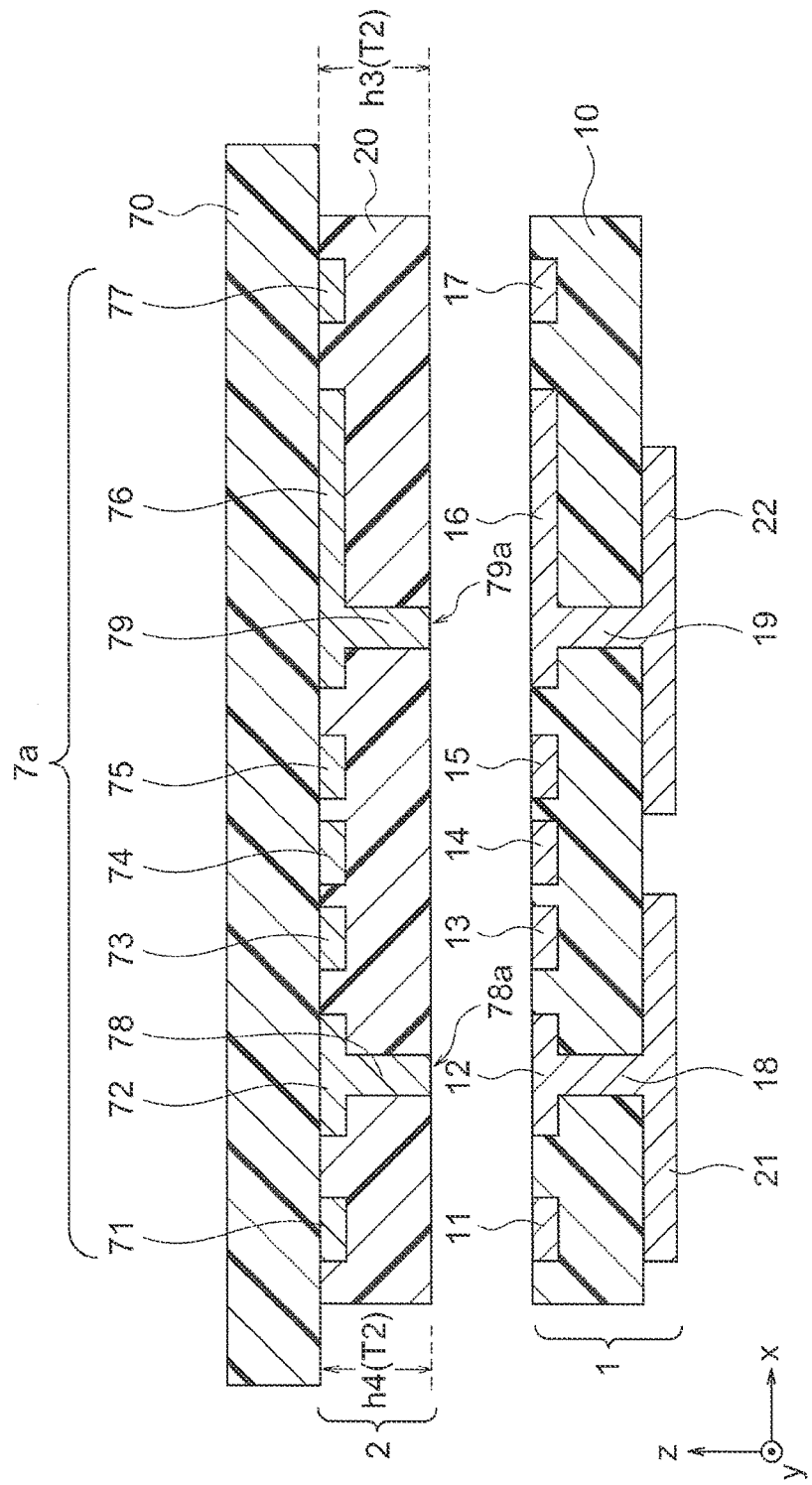
FIG. 17 is a process cross-sectional view illustrating one example of the manufacturing method for the wiring board according to the first embodiment of the second invention.

Subsequently, as shown in FIG. 17, the other main surface (lower surface in the figure) of the second insulating sheet 20 is caused to face the one main surface (upper surface in the figure) of the first substrate 1 in a state where the projections 78 and 79 and the convex portions 71 to 77 of the wiring body 7 still remain inserted in the second insulating sheet 20. Thereafter, the end portions 78a and 79a of the projections 78 and 79 exposed at the other main surface (lower surface in the figure) of the second insulating sheet 20 are aligned to respectively contact the first upper side wirings 12 and 16 of the first insulating sheet 10 using image recognition, pin-alignment or other appropriate means, and the second insulating sheet 20 is laminated on the first insulating sheet 10, as shown in FIG. 18.

In this laminating step, the second insulating sheet 20 laminated on the one main surface side (upper side in the figure) of the first insulating sheet 10 is hot-pressed along the laminating direction (z-axis direction) while being heated to a second set temperature T2.

The second set temperature T2 in the laminating step may be, such as, but not limited to, a temperature where the first insulating sheet 10 and the second insulating sheet 20 are softened to exhibit adhesiveness. At the second set temperature T2, the first insulating sheet 10 and the second insulating sheet 20 are fused or adhere to each other. The second set temperature T2 may be set as being less than the first set temperature T1, and may be 220° C. to 260° C., for example.

Figure 18:
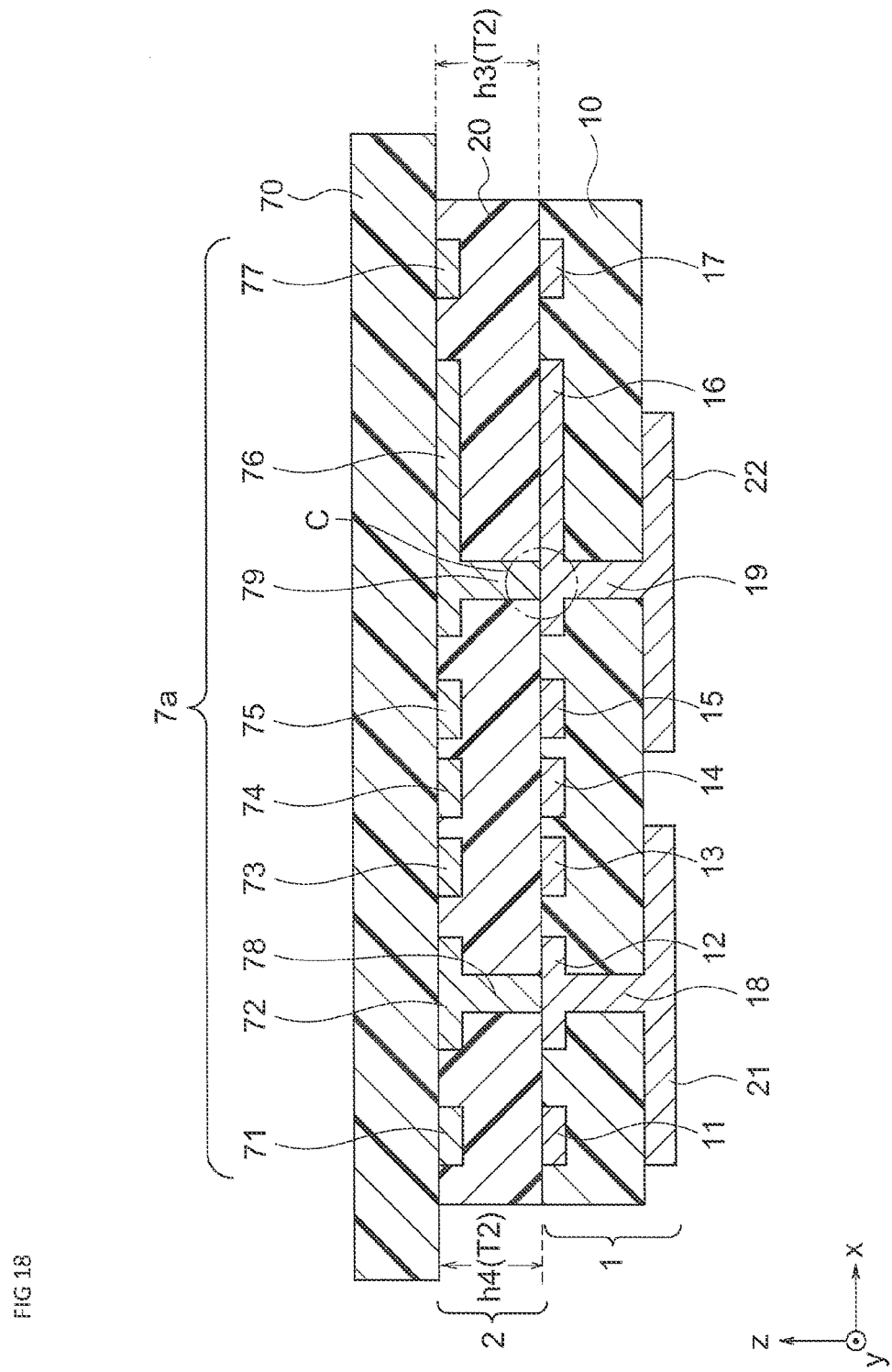
FIG. 18 is a process cross-sectional view illustrating one example of the manufacturing method for the wiring board according to the first embodiment of the second invention.

The end portions 78a and 79a of the projections 78 and 79 longer than the thickness of the second insulating sheet 20 are exposed at the other main surface side (lower side in the figure) of the second insulating sheet 20 before the second insulating sheet 20 is laminated on the first insulating sheet, so that the ends of the projections 78 and 79 and the first upper side wirings 12 and 16 can be ensured to contact each other, respectively, without any resin interposed in the contact portions between the ends of the projections 78 and 79 and the first upper side wirings 12 and 16, as shown in FIG. 18.

In addition, during this laminating step, the height h3 of the projections 78 and 79 and the thickness h4 of the second insulating sheet 20 can be made to be substantially the same. More specifically, the difference between the length h3 of the projections 78 and 79 and the thickness h4 of the second insulating sheet 20 may be about less than 10% of the length of the projections 78 and 79, preferably less than 5%, more preferably less than 3%, and most preferably less than 1%.

Thus, in the laminating step, the length h3 of the projections 78 and 79 and the thickness h4 of the second insulating sheet 20 are made to be substantially the same thereby to avoid the resin from flowing into the contact portions between the ends of the projections 78 and 79 and the first upper side wirings 12 and 16 even if a part of the second insulating sheet 20 is fluidized due to heating during the laminating. As a result, resin residues can be prevented from remaining between the ends of the projections 78 and 79 and the first upper side wirings 12 and 16. Moreover, in the laminating step, the length h3 of the projections 78 and 79 and the thickness h4 of the second insulating sheet 20 are made to be substantially the same thereby to prevent the ends of the projections 78 and 79 from strongly pressing against the first upper side wirings 12 and 16 to destroy them even if the second insulating sheet 20 is pressed against the first insulating sheet 10 during the laminating.

In fact, the present embodiment is such that the embedding step shown in FIG. 16 is performed at the first set temperature T1 and under the condition where the length h3 (T1) of the projections 78 and 79 of the wiring surface 7a is the thickness h4 (T1) of the second insulating sheet 20 or more while the laminating step shown in FIG. 18 is performed at the second set temperature T2 lower than the first set temperature T1 and under the condition where the length h3 (T2) of the projections 78 and 79 of the wiring surface 7a and the thickness h4 (T2) of the second insulating sheet 20 are substantially the same. Here, the condition, where the thickness of the second insulating sheet 20 is thinner than the length h3 of the projections 78 and 79 at the relatively high first set temperature T1 while the thickness of the second insulating sheet 20 is substantially the same as the length h3 of the projections 78 and 79 at the relatively low second set temperature T2, may appear to be contrary to the common general technical knowledge that the second insulating sheet 20 expands to become thicker as the temperature increases. As shown in FIG. 16, however, even if being applied with a relatively large pressing force during mold clamping in the embedding step, the softened second insulating sheet 20 is allowed to laterally expand toward the outer edge (right and left end portions of the second insulating sheet 20 in the figure). As shown in the figure, the end portions of the second insulating sheet 20 are rounded to absorb the expanded volume of the second insulating sheet. Accordingly, the condition can be established in the present embodiment, where: T1>T2; (the length h3(T1) of the projections 78 and 79)≥(the thickness h4(T1) of the second insulating sheet 20); and the length h3(T2) of the projections 78 and 79 and the thickness h4 (T2) of the second insulating sheet 20 are substantially the same, as described in the above.

After the laminating, the second insulating sheet 20, if being thermosetting resin, is completely cured by being heated for example at 180° C. during one hour using oven or other appropriate means. The second insulating sheet 20, if being thermoplastic resin, is cured by being cooled. Thereafter, the supporting member 70 of the wiring body 7 is removed from the second insulating sheet 20.

Figure 19:
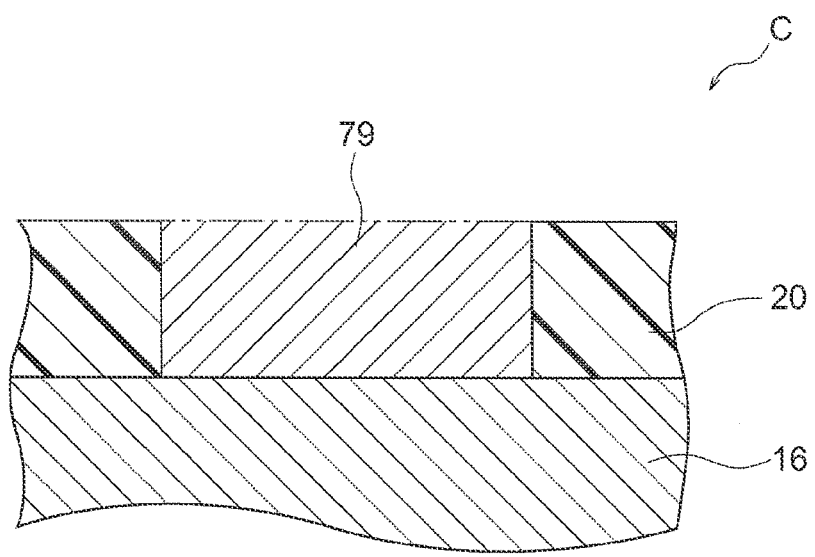
FIG. 19 is an enlarged view of region C shown in FIG. 18.

FIG. 19 is an enlarged view of region C surrounded by broken line in FIG. 18. As shown in FIG. 19, it is possible to avoid resin from remaining at connection portion between the projection 79 and the first upper side wiring 16 after the laminating. Thus, the second via 79P can be formed which is capable of being interlayer-connected to other element (the first upper side wiring 16) without any resin interposed therebetween, thereby enhancing the connection reliability. In addition, resin residue removing processes are not necessary, such as plasma irradiation, laser irradiation and chemical etching, for removing resin remaining in holes for forming via patterns, which would be required in the conventional method.

If a wiring board is obtained by a manufacturing method including plasma irradiation or laser irradiation, then the patterns and/or the insulating sheets thereof will involve lost parts and/or defect traces, while if a wiring board is obtained by a manufacturing method including chemical etching process, then the patterns and/or the insulating sheets thereof will involve chemical erosion traces. In contrast, according to the manufacturing method of the present embodiment, the wiring board 100 can be provided which can avoid such lost parts, defects or chemical erosions caused due to resin residue removing processes.

Figure 20:
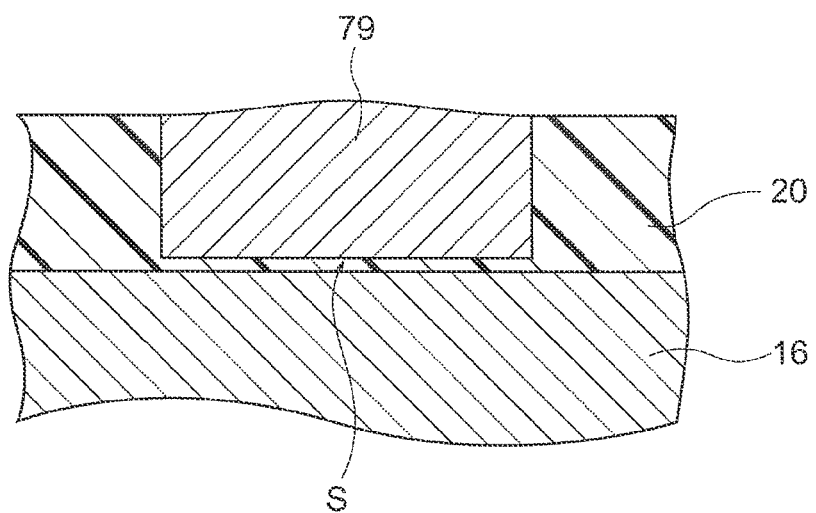
FIG. 20 is an enlarged view of a region, corresponding to the region C shown in FIG. 18, obtained by a manufacturing method according to a comparative example.

In order to confirm advantageous effects resulted from the manufacturing method according to the present embodiment, a manufacturing method according to Comparative Example 3 has been carried out in which the step for pressing the wiring body 7 against the one main surface of the second insulating sheet 20 is different from the present embodiment only in the point that the length h3 of the projections 78 and 79 is less than the thickness h4 of the second insulating sheet 20, and an observation has also been performed for the condition of the connection portion between the projection 79 of the wiring body 7 and the first upper side wiring 16. FIG. 20 schematically illustrates the condition of this comparative example, which corresponds to region C in FIG. 18. As shown in FIG. 20, resin S remains at the connection portion between the projection 79 of the wiring body 7 and the first upper side wiring 16. Due to this resin S, the contact area for the connection portion between the projection 79 and the first upper side wiring 16 is reduced, and the connection reliability is thus deteriorated.

Similarly, a manufacturing method according to Comparative Example 4 has been carried out in which the step for laminating the second insulating sheet 20 on the first insulating sheet 10 is different from the present embodiment only in the point that the length h3 of the projections 78 and 79 is less than the thickness h4 of the second insulating sheet 20, and an observation has also been performed for the condition of the connection portion between the projection 79 and the first upper side wiring 16 after the laminating. Like the above Comparative Example 3, resin S remains at the connection portion between the projection 79 and the first upper side wiring 16. This condition is similar to the condition schematically illustrated in FIG. 20, which corresponds to the previously-described region C in FIG. 18. Due to this resin S, the contact area for the connection portion between the projection 79 and the first upper side wiring 16 is reduced, and the connection reliability is thus deteriorated.

As heretofore described, according to the manufacturing method for the wiring board 100 in the present embodiment of this invention, the end portions 78a and 79a of the projections 78 and 79 are exposed at the lower surface side of the second insulating sheet 20 when the second insulating sheet 20 is laminated on the first insulating sheet 10, thereby ensuring the second vias 78P and 79P and the first upper side wirings 12 and 16 to respectively be connected with each other, and the wiring board 100 can thus be produced which has high connection reliability.

In addition, production cost can be reduced because a step for filling a conductive material in grooves and holes formed depending on patterns is not necessary, which would be required in the conventional method.

<Second Embodiment of Second Invention>

A second embodiment of the second invention will hereinafter be described with reference to FIG. 21 to FIG. 23. The present embodiment is characterized in that a cushion sheet 60 is located on the other main surface side of the second insulating sheet 20 in the embedding step in the first embodiment of the second invention. In order to avoid redundant descriptions, different aspects from the first embodiment will hereinafter be focused, and descriptions for common entities will be represented by those for the first embodiment of the second invention.

Figure 21:
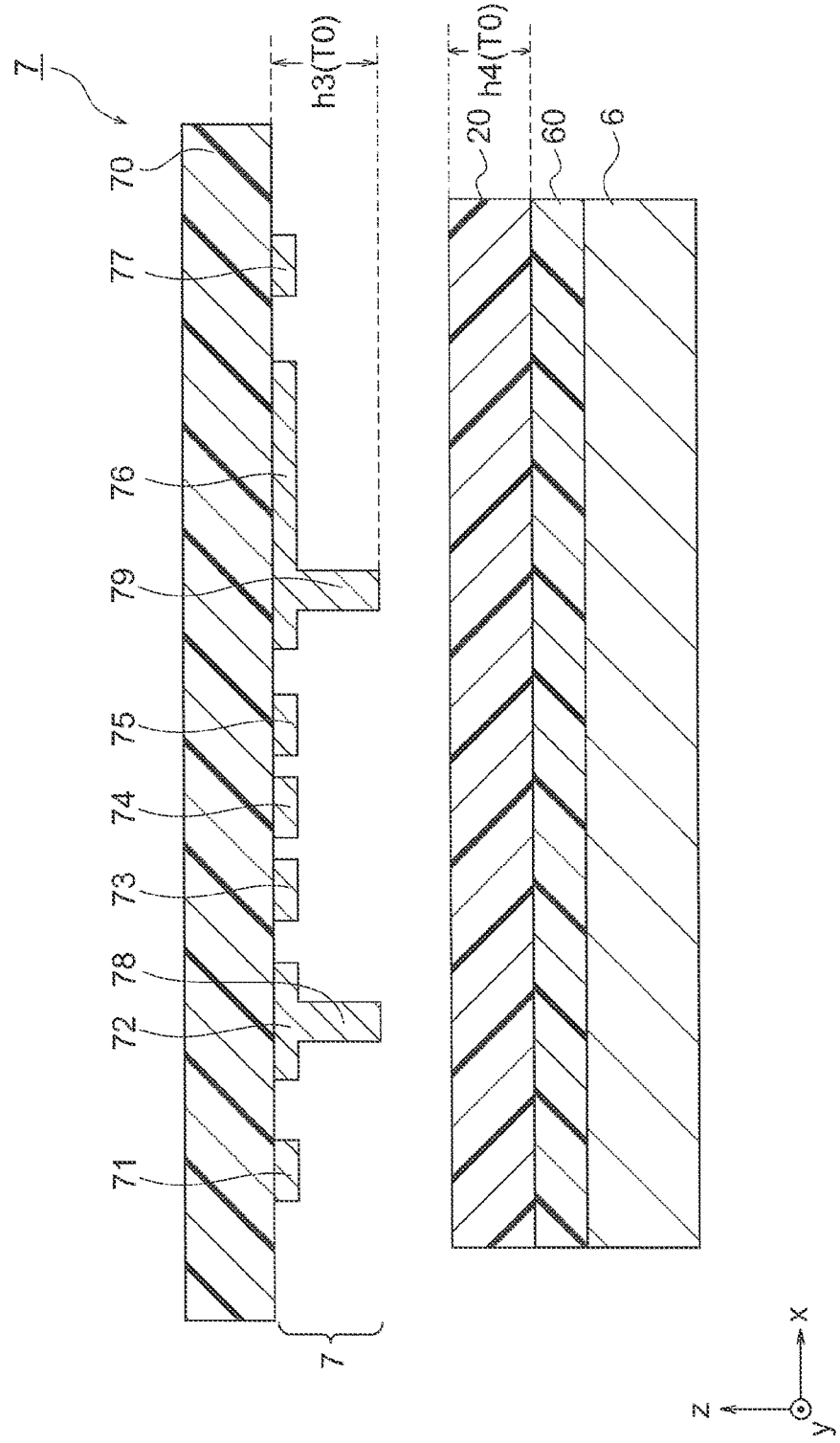
FIG. 21 is a process cross-sectional view illustrating one example of a manufacturing method for a wiring board according to a second embodiment of the second invention.

FIG. 21 corresponds to FIG. 15 in the first embodiment, which illustrates a set condition before the embedding step. As shown in FIG. 21, in the present embodiment, the cushion member 60 which has elasticity is located on the other main surface side (lower surface side in the figure) of the second insulating sheet 20. As the cushion member 60, a film or a porous member may be used, such as made of thermoplastic resin, polyethylene terephthalate (PET), polytetrafluoroethylene (PTFE) or fluorine resin.

Under a similar condition to the first embodiment, i.e. under the first set temperature T1, the wiring surface 7a of the wiring body 7 is pressed against the second insulating sheet 20. In this embedding step, the length h3 (T1) of the projections 78 and 79 is set as being larger than the thickness h4 (T1) of the second insulating sheet 20.

Figure 22:
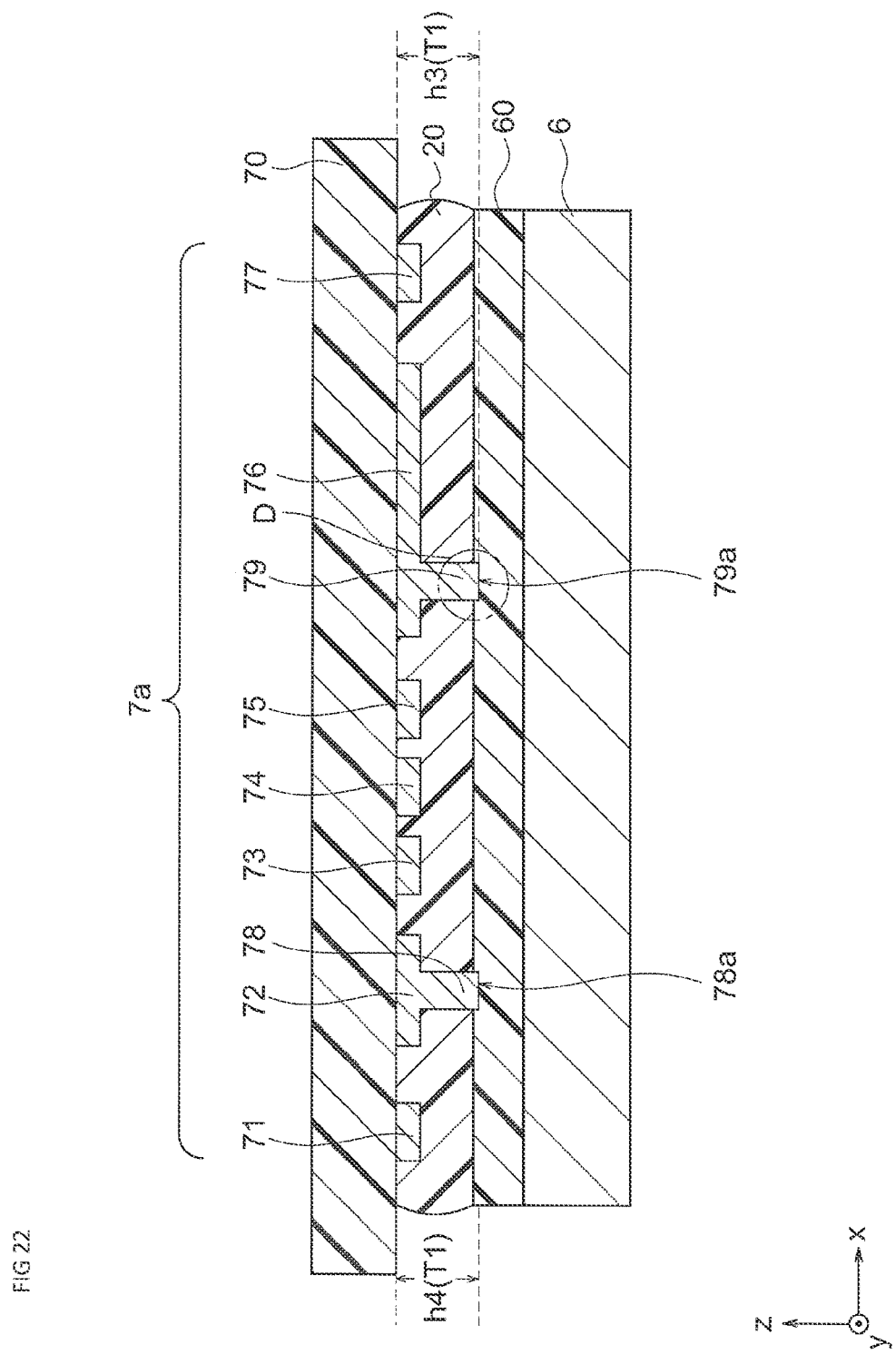
FIG. 22 is a process cross-sectional view illustrating one example of the manufacturing method for the wiring board according to the second embodiment of the second invention.
Figure 23:
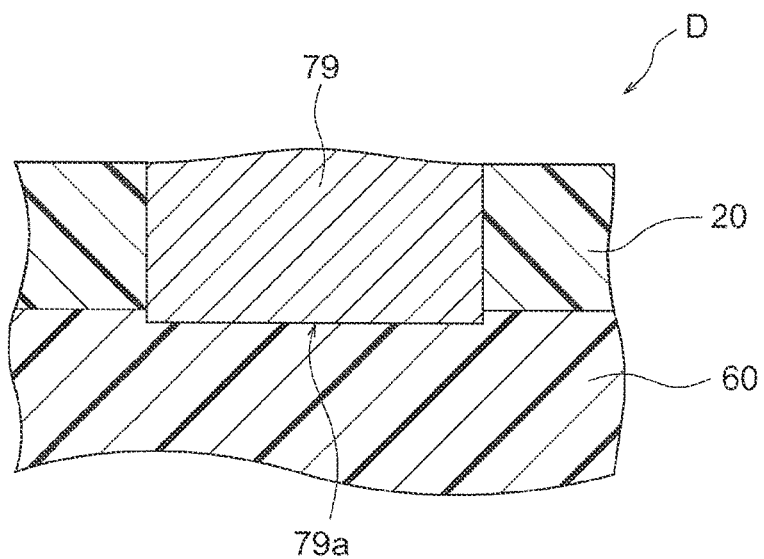
FIG. 23 is an enlarged view of region D shown in FIG. 22.

As shown in FIG. 22, in the embedding step, the end portions 78a and 79a of the projections 78 and 79 are exposed at the other main surface side (lower surface side in the figure) of the second insulating sheet 20, and these exposed end portions 78a and 79a press against the cushion member 60. The cushion member 60 is pressed by the end portions 78a and 79a to be depressed and deforms along the shapes of the end portions 78a and 79a. An enlarged view of region D of FIG. 22 in this state is shown in FIG. 23. As shown in FIG. 23, the end portion 79a is exposed at the other main surface of the second insulating sheet 20 and further sinks into the cushion member 60.

Thus, the cushion member 60 having elasticity is located on the other main surface side (lower surface side in the figure) of the second insulating sheet 20 thereby allowing the end portions 78a and 79a to penetrate the second insulating sheet 20 even with small force.

Particularly, if, in the embedding step of the present embodiment, the length h3 (T1) of the projections 78 and 79 is set as being the thickness h4 (T1) of the second insulating sheet 20 or more under the first set temperature T1 while, in the laminating step, the length h3 (T2) of the projections 78 and 79 and the thickness h4 (T2) of the second insulating sheet 20 are set as being substantially the same under the second set temperature T2, then high accuracy is required for the control of the material, the thickness and the temperature of the second insulating sheet 20 and the length of the projections 78 and 79. Given such a situation, even in the case where some variation occurs in the relationship between the length h3 of the projections 78 and 79 and the thickness h4 of the second insulating sheet 20, if the cushion member 60 is located, then the pressing force to the second insulating sheet 20 in the embedding step can be controlled to thereby expose the end portions 78a and 79a of the projections 78 and 79 at the other main surface side of the second insulating sheet 20.

As described in the above, according to the manufacturing method for the wiring board 100 in the second embodiment of the second invention, similar actions and advantageous effects to those in the first embodiment can be obtained, and in addition to this, the projections 78 and 79 can be exposed at the other main surface side of the second insulating sheet 20 with relatively small force because the cushion member 60 is located on the other main surface side of the second insulating sheet 20 in the embedding step. Moreover, even if a variation occurs in the relationship between the length h3 of the projections 78 and 79 and the thickness h4 of the second insulating sheet 20, such a variation will be absorbed and the projections 78 and 79 can thus be ensured to expose at the other main surface side of the second insulating sheet 20.

It should be appreciated that the embodiments heretofore explained are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 . . . first substrate
2 . . . second substrate
4 . . . mold
40 . . . supporting member
41 to 47 . . . convex portion
48, 49 . . . projection
10 . . . first insulating sheet
11 to 17 . . . first upper side wiring
18, 19 . . . first via
21, 22 . . . first lower side wiring
20 . . . second insulating sheet
31 to 37 . . . second upper side wiring
38, 39 . . . second via
51 to 57 . . . groove portion (concave portion)
58, 59 . . . hole (via hole)
6 . . . stage
60 . . . cushion sheet (cushion member)
7 . . . wiring body
70 . . . supporting member
7a . . . wiring surface
71 to 77 . . . convex portion, wiring portion
78, 79 . . . projection (wiring portion)
71P to 77P . . . second upper side wiring
78P, 79P . . . second via

What is claimed is:
1. A manufacturing method for a wiring board, comprising:
preparing a first substrate, the first substrate comprising a first insulating sheet and a first wiring formed on one main surface of the first insulating sheet;
preparing a mold having a stamping surface, the stamping surface including a convex portion and a projection, the convex portion being formed depending on a wiring pattern constituting at least a part of patterns of a second substrate to be laminated on the first substrate, the projection being formed depending on a via pattern constituting at least a part of the patterns;
locating the stamping surface of the mold to face one main surface side of a second insulating sheet and heating the second insulating sheet to a first set temperature to press the mold against the one main surface of the second insulating sheet so that at least an end portion of the projection of the stamping surface is exposed at other main surface side of the second insulating sheet;
heating at least the second insulating sheet to a second set temperature to laminate the second insulating sheet on the first insulating sheet so that the end portion of the projection exposed at the other main surface of the second insulating sheet contacts the first wiring of the first insulating sheet;
cooling at least the second insulating sheet to release the mold from the second insulating sheet; and
filling a conductive material in a groove portion and a hole, the groove portion and the hole being formed in the second insulating sheet respectively by the convex portion of the mold and the projection of the mold.

2. The manufacturing method for a wiring board as set forth in claim 1, wherein
- the pressing the mold against the one main surface of the second insulating sheet is such that a length h1 of the projection formed depending on the via pattern is a thickness h2 of the second insulating sheet or more, and
- the laminating the second insulating sheet on the first insulating sheet is such that the length h1 of the projection formed depending on the via pattern and the thickness h2 of the second insulating sheet are substantially the same.

3. The manufacturing method for a wiring board as set forth in claim 1, wherein
- the pressing the mold against the one main surface of the second insulating sheet includes locating a cushion sheet on the other main surface side of the second insulating sheet, and
- the laminating the second insulating sheet on the first insulating sheet includes removing the cushion sheet.

* * * * *